(12) United States Patent
Orr et al.

(10) Patent No.: US 10,006,942 B2
(45) Date of Patent: Jun. 26, 2018

(54) BOARD, INTEGRATED CIRCUIT TESTING ARRANGEMENT, AND METHOD FOR OPERATING AN INTEGRATED CIRCUIT

(71) Applicant: Intel IP Corporation, Santa Clara, CA (US)

(72) Inventors: Benjamin Orr, Munich (DE); Harald Gossner, Riemerling (DE)

(73) Assignee: INTEL IP CORPORATION, Santa Clara, CA (US)

(*) Notice: Subject to any disclaimer, the term of this patent is extended or adjusted under 35 U.S.C. 154(b) by 674 days.

(21) Appl. No.: 13/892,398

(22) Filed: May 13, 2013

(65) Prior Publication Data

US 2014/0333339 A1  Nov. 13, 2014

(51) Int. Cl.
*G01R 31/02* (2006.01)
*G01R 1/073* (2006.01)
(Continued)

(52) U.S. Cl.
CPC ....... *G01R 1/07378* (2013.01); *G01R 31/002* (2013.01); *H05K 1/11* (2013.01); *H05K 1/0268* (2013.01); *H05K 1/144* (2013.01); *H05K 2201/09227* (2013.01); *H05K 2201/10378* (2013.01)

(58) Field of Classification Search
CPC ...... G01R 1/0491; G01R 31/02; G01R 31/20; G01R 31/2886; G01R 31/318572; G01R 31/31924; G01R 31/31926; G01R 35/005; G01R 1/073; G01R 1/07307; G01R 31/2889; G01R 1/07342; G01R 1/0408; G01R 1/06711; H05K 1/0296

USPC ........... 324/756.02, 754.01, 754.03, 754.07, 324/754.21, 755.01, 756.03, 758.01, 690, 324/696, 724

See application file for complete search history.

(56) References Cited

U.S. PATENT DOCUMENTS 6,177,298 B1 * 1/2001 Quigley ............. H01L 27/0251
  438/135
6,330,164 B1 * 12/2001 Khandros ............ B23K 20/004
  257/724

(Continued)

OTHER PUBLICATIONS

Valeria, Design and Verification of Digital Systems, Chapter 2, p. 9-42, www.eecs.umich.edu.pdf, no date.*

(Continued)

*Primary Examiner* — Jermele M Hollington
*Assistant Examiner* — Taqi Nasir
(74) *Attorney, Agent, or Firm* — Viering Jentschura & Partner MBB

(57) ABSTRACT

A board may include a first set of board contact pads arranged on a first side of the board, the pads configured to connect to circuit pads of a circuit under test, the positions of the pads matching to the positions of the circuit pads; a fan-out region on the first side of the board including fan-out contact pads configured to at least one of receive a test signal and provide a measurement signal; at least one contact pad connecting to at least one pad of the first set of board pads; and a second set of board contact pads on a second side of the board, the second set of board pads configured to connect to test board pads of a test board; positions of the pads matching to the positions of the test board pads; a pad connecting to a pad of the first set of board pads.

23 Claims, 13 Drawing Sheets

(51) Int. Cl.
*H05K 1/11* (2006.01)
*G01R 31/00* (2006.01)
*H05K 1/14* (2006.01)
*H05K 1/02* (2006.01)

(56) References Cited

U.S. PATENT DOCUMENTS

| | | | | |
|---|---|---|---|---|
| 6,809,522 | B2* | 10/2004 | Nguyen | G01R 31/002 |
| | | | | 324/457 |
| 2002/0155735 | A1* | 10/2002 | Zhou | G01R 1/06711 |
| | | | | 439/66 |
| 2006/0033517 | A1* | 2/2006 | Khandros | B23K 20/004 |
| | | | | 324/755.01 |
| 2007/0018672 | A1* | 1/2007 | Jacobsen | G01R 31/2853 |
| | | | | 324/754.28 |
| 2009/0024780 | A1* | 1/2009 | Lang | H04L 12/40 |
| | | | | 710/305 |
| 2009/0224780 | A1* | 9/2009 | Chao | G01R 1/0735 |
| | | | | 324/762.05 |
| 2010/0264935 | A1* | 10/2010 | Erdman | G01R 1/0466 |
| | | | | 324/537 |
| 2011/0157853 | A1* | 6/2011 | Goh | H01L 21/563 |
| | | | | 361/783 |
| 2013/0027071 | A1* | 1/2013 | Canegallo | G01R 31/2889 |
| | | | | 324/754.21 |
| 2013/0027073 | A1* | 1/2013 | Pagani | G01R 31/2889 |
| | | | | 324/756.03 |
| 2014/0073071 | A1* | 3/2014 | Diorio | G06K 19/0723 |
| | | | | 438/26 |

OTHER PUBLICATIONS

Robot Room, Double-sided copper, www.robotroom.com/PCB2.html, p. 1-6, 2000.*

Zhang, EE Times, Reduce your PCB costs with blind vias, buried vias, and microvias, www.eetimes.com, p. 1-4, 2014N.*

Nakajima, et al., A portable co-verification system which generates testbench automatically, 2007, FPT, p. 345-348, IEEE, http://dblp.uni-trierde/db/conf/fpt/fpt2007.html#NakajimaNKS07.*

Johnsson et al., "Study of System ESD Codesign of a Realistic Mobile Board", Proc. EOSESD Symposium 2011.

Li et al., "An application of utilizing the system-efficient-ESD-design (SEED) concept to analyze an LED protection circuit of a cell phone," Electromagnetic Compatibility (EMC), 2012 IEEE International Symposium on, pp. 346-350, Aug. 6-10, 2012.

Ker et al., "Hardware/firmware co-design in an 8-bits microcontroller to solve the system-level ESD issue on keyboard," Electrical Overstress/Electrostatic Discharge Symposium Proceedings, 1999, pp. 352-360, Sep. 28-30, 1999.

* cited by examiner

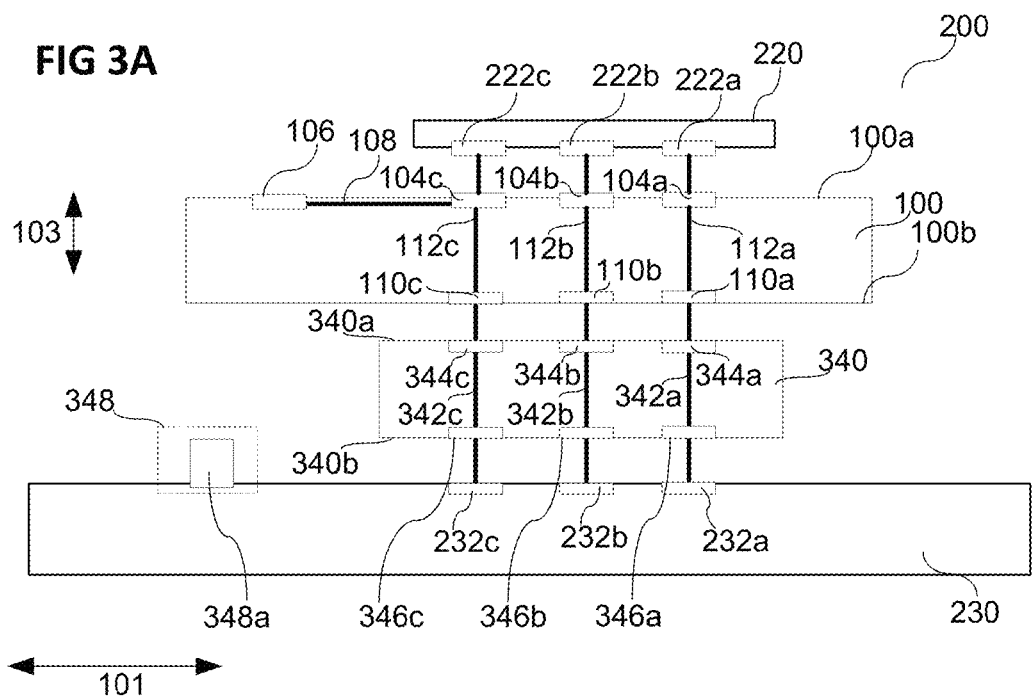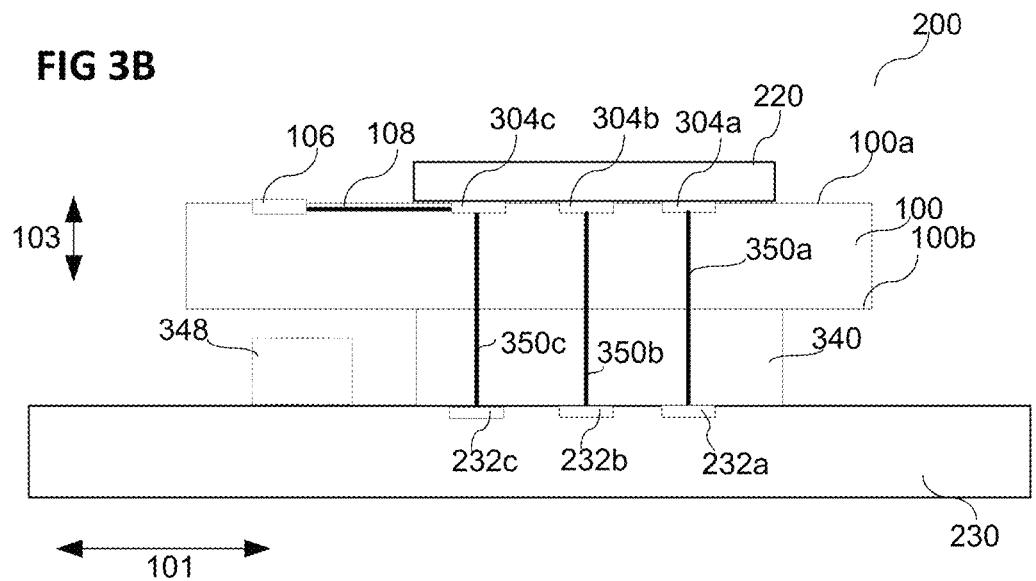

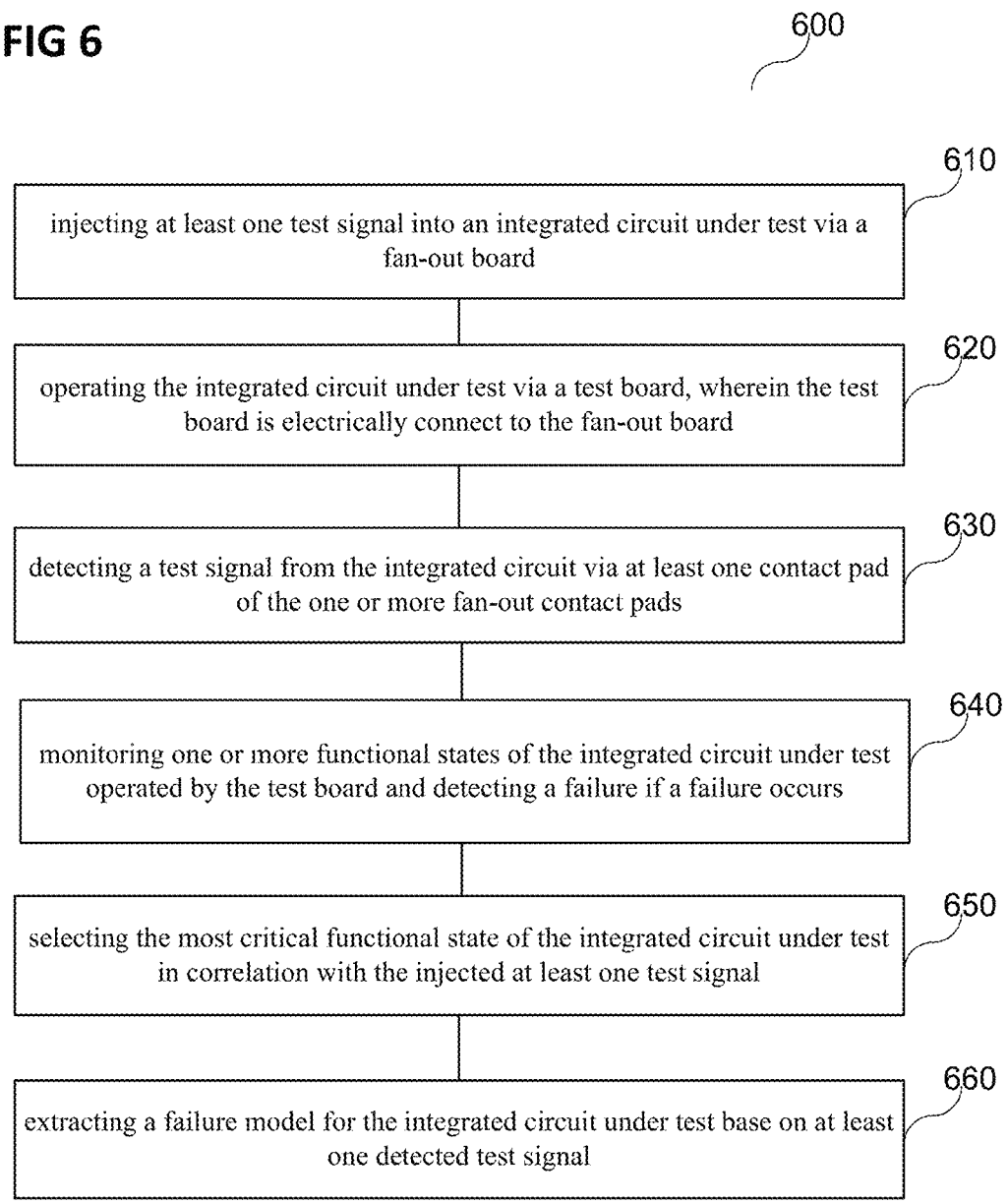

BOARD, INTEGRATED CIRCUIT TESTING ARRANGEMENT, AND METHOD FOR OPERATING AN INTEGRATED CIRCUIT

TECHNICAL FIELD

Various aspects of this disclosure relate generally to a board, an integrated circuit testing arrangement, and a method for operating an integrated circuit.

BACKGROUND

An integrated circuit may be susceptible to an electrostatic discharge (ESD) which may cause a failure in the integrated circuit (IC). Therefore, also an electronic device including an integrated circuit may be prone to electrostatic discharge failures, which may result in reduced lifetime of the electronic device. There may be different approaches to enhance the ESD robustness of an electronic device, including for example electrostatic discharge protection of components (component-level ESD protection) and system level electrostatic discharge protection. The system level electrostatic discharge protection may consider the behavior of an electronic device including external pins, pins being directly accessible, and also internal integrated components or pins, since a damaging current pulse may reach an ESD sensitive region or pin within the electronic device. To solve actual problems referring to ESD failures, ESD testing may be necessary, for example to develop an ESD robust system design or to understand and consider the effects of ESD failures in an electronic device during an early state of the manufacturing and/or development. There may be different standard models to test and/or analyze the ESD robustness of an electronic device, such as the human body model (HBM), the machine model (MM), the charged device model (CDM), and the socketed discharge model (SDM).

SUMMARY

A board may include a first set of board contact pads arranged on a first side of the board, the pads configured to connect to circuit pads of a circuit under test, the positions of the pads matching to the positions of the circuit pads; a fan-out region on the first side of the board including fan-out contact pads configured to at least one of receive a test signal and provide a measurement signal; at least one contact pad connecting to at least one pad of the first set of board pads; and a second set of board contact pads on a second side of the board, the second set of board pads configured to connect to test board pads of a test board; positions of the pads matching to the positions of the test board pads; a pad connecting to a pad of the first set of board pads.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A and FIG. 3B respectively show a schematic side view or a schematic cross sectional view of an integrated circuit testing arrangement;

FIG. 5 and FIG. 6 show respectively a flow diagram of a method for operating an integrated circuit;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In general it may be difficult to characterize a hidden pin of the integrated circuit or the integrated circuit structure since a hidden pin may not be easily accessible for ESD testing (electrostatic discharge testing). There may be the possibility to provide a special design of a testing board, or a so-called system verification board, which can expose test pads which are connected to the desired pins under test. However, this may need to be accounted for with a specific design of a large printed circuit board being configured as a test board. Therefore, it may be expensive to adapt these larger test boards to meet the respective requirement for a desired device to be tested. Further, there may be problems providing test pads on the test board near an integrated circuit pin, which shall be tested, due to the required placement of other components of the test board, such as decoupling capacitors, and due to area restrictions on the test board. Further, distant test pads would not allow injection of a predefined waveform into the integrated circuit due to interconnect parasitics inherent in long traces, e.g. resistance, capacitance, and inductance (RLC) parasitics. For ESD Test on system level there may be a standard test method IEC 61000-4-2. However, there may be a need to characterize subsystems and especially integrated circuits (ICs) early in the system design process to support the design for enhanced system ESD robustness. Therefore, the evaluation of susceptibility of the integrated circuit to hard and soft fails may be evaluated before the integrated circuit is mounted in the final product.

As shown in the following, a board (a fan-out board) may be provided which may allow or may assist to characterize an integrated circuit or an integrated circuit structure (or integrated circuit system) by performing one or more system level electrostatic discharge (ESD) tests.

Figure 1A:
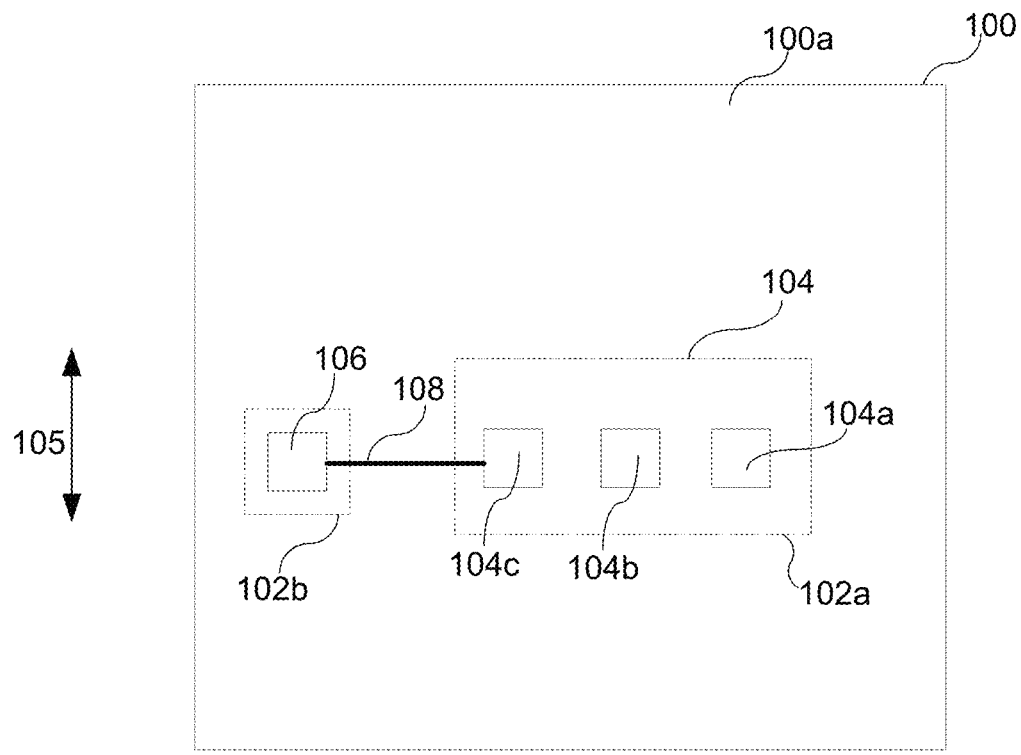
FIG. 1A schematically shows a top view of a board or fan-out board.
Figure 1B:
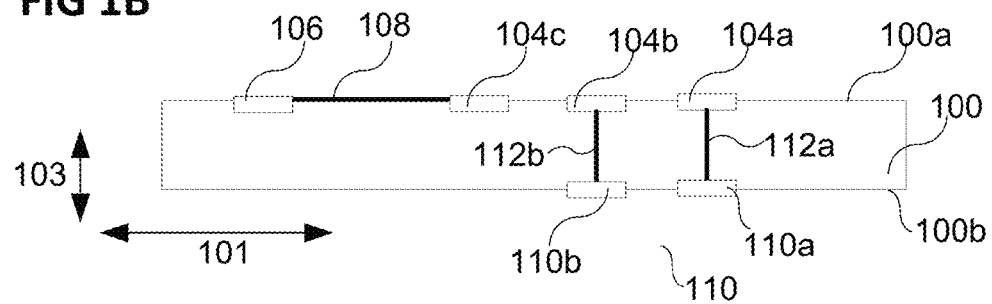
FIGS. 1B to 1D schematically show respectively a side view or a cross sectional view of a board or fan-out board.

FIG. 1A shows a board 100 (e.g. a fan-out board 100) in a top view and FIG. 1B shows accordingly a cross sectional view (or a side view) of the board 100. The board 100 may include at least a first set 104 of board contact pads, a second set 110 of board contact pads and at least one fan-out contact pad 106 (one or more fan-out contact pads 106).

The first set 104 of board contact pads may include the board contact pads 104a, 104b, 104c, as illustrated in FIG. 1A. Furthermore, the first set 104 of board contact pads may include more or less contact pads than illustrated in the figures as described herein. The first set 104 of board contact pads may include one, two, three, four, five, six, seven, eight, nine, ten or more than ten contact pads, e.g. more than 20, e.g. more than 30, e.g. more than 40, e.g. more than 50, or even up to 100 or more than 100 contact pads, depending on the desired integrated circuit to be tested (also referred to as integrated circuit under test in the following) and/or the number of pins to be tested (also referred to as pins under test in the following). The first set 104 of board contact pads may be arranged on a first side 100a of the board 100, e.g. on the top side 100a of the board 100. The first set 104 of board contact pads may be for example arranged in a first region 102a, wherein the first set 104 of board contact pads may be arranged and/or positioned such that an integrated circuit can be mounted on the first side 100a of the board 100 and can be electrically connected to the board 100 via the first set 104 of board contact pads. The positions of the contact pads of the first set 104 of board contact pads may match to the positions of the contact pads of an integrated circuit under test. Further, the board 100 may be configured to receive an integrated circuit. The first set 104 of board contact pads may be configured to electrically connect to integrated circuit contact pads of the integrated circuit under test.

There may be various possibilities and modifications in providing contact pads, e.g. providing board contact pads and fan-out contact pads. The contact pads (board contact pads and/or fan-out contact pads) may line up with the respective surface 100a, 100b of the board 100 (or may flush with the respective surface 100a, 100b of the board 100), or may protrude from the respective surface 100a, 100b of the board 100 as illustrated in the figures. The first set 104 of board contact pads and the one or more fan-out contact pads 106 may also be recessed within the surface 100a of the board 100. The thickness of a contact pad, e.g. the extension along the direction 103 as shown for example in FIG. 1B, may be in the range from about a hundred micrometers to about millimeters, e.g. in the range from about 100 μm to about 5 mm. The lateral extension of a contact pad, e.g. along the direction 101 and direction 105 as shown in FIG. 1A and FIG. 1B, may be in the range from tens of micrometers to about hundreds of micrometers, or millimeters, or centimeters, e.g. in the range from about 10 μm to about 1 cm. The lateral extension of the contact pads of the first set 104 of board contact pads may depend on the dimensions of the contact pads of the integrated circuit under test on the board 100.

A fan-out region 102b may be arranged or may be provided on the first side 100a of the board 100. The fan-out region 102b may include one or more fan-out contact pads 106. In other words, one or more fan-out contact pads 106 may be provided on the first side 100a of the board 100, e.g. being arranged within a fan-out region 102b. The fan-out region 102b may include one, two, three, four, five, six, seven, eight, nine, ten or more than ten fan-out contact pads 106, e.g. more than 20, e.g. more than 30, e.g. more than 40, e.g. more than 50, or even up to 100 fan-out contact pads 106, e.g. depending of the number of pins to be tested via the one or more fan-out contact pads 106. The one or more fan-out contact pads 106 may be configured as a fan-out contact pad structure, to inject for example a signal (or for example at least one of a current and a voltage) into a pin to be tested (or into an integrated circuit to be tested) and to transmit one or more signals from the board 100 to a periphery, e.g. to a measurement arrangement or an electronic testing device.

The first side 100a and the second side 100b of the board 100 may be opposite sides of the board 100. At least one fan-out contact pad 106 of the one or more fan-out contact pads 106 may electrically conductively connect to at least one contact pad 104c of the first set 104 of board contact pads. The electrically conductive connection may be provided by a wiring structure 108, wherein the wiring structure 108 may include an electrically conductive material connecting at least one board contact pad and at least one fan-out contact pad 106. The wiring structure 108 may be a single level wiring or a multi-level wiring. The wiring structure 108 may be provided on the surface 100a of the board 100, e.g. be providing a patterned metal layer 108 or a patterned metallization structure 108. The wiring structure 108 may be at least partially provided in the board 100, e.g. as a buried wiring structure 108 or as a wiring layer within the board 100. The wiring structure 108 may include at least one metallization layer and may further include one or more vias.

The one or more fan-out contact pads may be configured to at least one of receive a test signal and provide a measurement signal. In other words, the one or more fan-out contact pads may provide at least a part of an interface to transmit one or more signals, e.g. to transmit current signals or voltage signals, from the integrated circuit under test to an external device and/or from an external testing device to the integrated circuit under test. The external testing device may be for example an ESD testing device, e.g. to inject a transmission line pulse (TLP) into an integrated circuit under test.

The second set 110 of board contact pads may be arranged or may be provided on the second side 100b of the board 100. The second set 110 of board contact pads may include one, two, three, four, five, six, seven, eight, nine, ten or more than ten board contact pads, e.g. more than 20, e.g. more than 30, e.g. more than 40, e.g. more than 50, or even up to 100 or more than 100 board contact pads. The number of board contact pads 110 arranged on the second side 100b of the board 100 may for example depend on the number of board contact pads 104 provided on the first side 100a of the board 100. The fan-out board 100 may route the contact pads of the integrated circuit under test to the bottom side 100b of the fan-out board 100 to connect the integrated circuit under test to a test board.

At least one contact pad 110a, 110b of the second set 110 of board contact pads may electrically conductively connect to at least one contact pad 104a, 104b of the first set 104 of board contact pads. Each contact pad of the second set 110 of board contact pads may electrically conductively connect to the respective contact pad of the first set 104 of board contact pads. All contact pads of the first set 104 of board contact pads may electrically conductively connect to a corresponding contact pad of the second set 110 of board contact pads, e.g. in a one to one relation or in a unambiguous assignment. Therefore, all (or all desired) contact pads of an integrated circuit under test may be forwarded to a test board (see e.g. FIG. 2C) via the board 100. The electrically conductive connection between a contact pad of the first set 104 of board contact pads and an associated contact pad of the second set 110 of board contact pads may be provided by a via or a via structure. As shown in FIG. 1B, at least one contact pad 104a, 104b of the first set 104 of board contact pads may electrically conductively connect to at least one contact pad 110a, 110b of the second set 110 of board contact pads by at least one via 112a, 112b or via structure 112a, 112b.

The second set 110 of board contact pads on the second side 100b of the board 100 may be configured to electrically connect to test board contact pads of a test board. Therefore, the positions of the contact pads of the second set 110 of board contact pads may match to the positions of the test board contact pads of the test board (see e.g. FIG. 2C). At least one contact pad 110a, 110b of the second set 110 of board contact pads may electrically conductively connect to at least one contact pad 104a, 104b of the first set 104 of board contact pads, as shown in FIG. 1B.

Figure 1C:
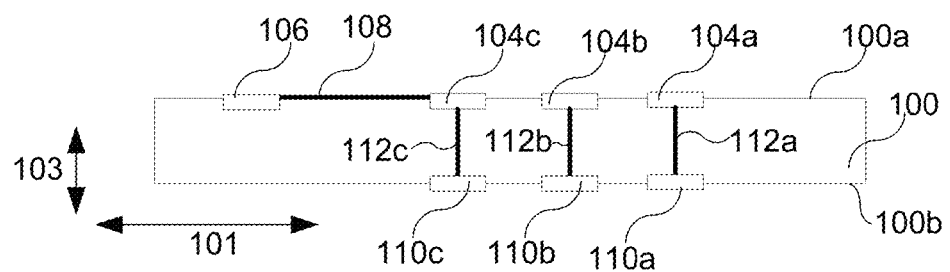

The number of board contact pads 110 arranged on the second side 100b of the board 100 may be for example equal to the number of board contact pads 104 provided on the first side 100a of the board 100, as exemplarily shown in FIG. 1C. Further, each contact pad of the first set 104 of contact pads may be electrically coupled by a via 112a, 112b, 112c to the corresponding contact pad of the second set 110 of contact pads. The board 100 may include a routing structure or a wiring structure, such that the contact pads 104a, 104b, 104c of the first set 104 of contact pads may be electrically coupled to a desired contact pad 110a, 110b, 110c of the second set 110 of contact pads.

Figure 1D:
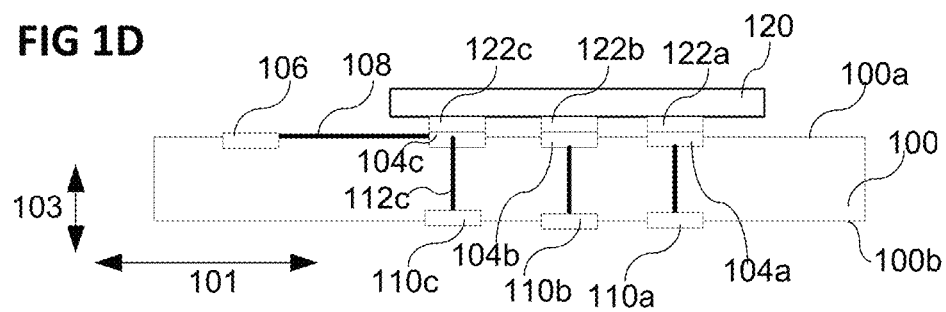

Therefore, as illustrated in FIG. 1D, the integrated circuit 120 under test may include for example a specific number of integrated circuit contact pads 122a, 122b, 122c. The number of board contact pads 104a, 104b, 104c on the first side 100a of the board 100 may be equal to the number of integrated circuit contact pads 122a, 122b, 122c. Further, the number of board contact pads 110a, 110b, 110c on the second side 100b of the board 100 may be equal to the number of integrated circuit contact pads 122a, 122b, 122c and to the number of board contact pads 104a, 104b, 104c on the first side 100a of the board 100. Therefore, each integrated circuit contact pad 122a, 122b, 122c of the integrated circuit may be electrically conductively connected to a respective board contact pad 110a, 110b, 110c on the second side 100b of the board 100.

As illustrated in FIG. 1D, the integrated circuit 120 under test may include for example a specific number of integrated circuit contact pads 122a, 122b, 122c to be connected to a test board such that the integrated circuit 120 under test may be operated by the test board; and the integrated circuit 120 under test may include at least one integrated circuit contact pad 122c, e.g. a hidden pin 122c, to be subjected to an ESD test. Therefore, each integrated circuit contact pad 122a, 122b, 122c of the integrated circuit may electrically conductively connect to a respective board contact pad 110a, 110b, 110c on the second side 100b of the board 100. Further, the at least one integrated circuit contact pad 122c may be electrically conductively connected to the at least one fan-out contact pad 106. This may allow the integrated circuit 120 electrically conductively connecting to the first set 104 of contact pads on the first side 100a of the board 100 to be operated by a test board (e.g. by a printed circuit board assembly configured to operate and/or test an integrated circuit) electrically conductively connecting to the second set 110 of contact pads on the second side 100b of the board 100; and testing (e.g. injecting an ESD test signal, e.g. a TLP) the integrated circuit contact pad 122c via the at least one fan-out contact pad 106. Therefore, using the board 100 may enable to operate an integrated circuit under test 120 and subjecting the operated integrated circuit under test 120 to an ESD testing via an external testing device being electrically conductively connected to the fan-out contact pad 106 of the board 100 (see e.g. FIG. 7A).

A contact pad (e.g. a board contact pad or a fan-out contact pad) may include at least one material of the following group of materials or may be formed of at least one material of the following group of materials: an electrically conducting material, a metal, a metallic material, a doped semiconductor, aluminum, copper, an aluminum/copper alloy, titanium, titanium nitride, tungsten, tantalum, doped polysilicon, or any other suitable material, e.g. an electrically conducting polymer or an electrically conducting organic material. A wiring structure 108 or a metallization structure (e.g. a via 112a, 112b, 112c or an electrical connection 108) may include at least one material of the following group of materials or may be formed of at least one material of the following group of materials: an electrically conducting material, a metal, a metallic material, a doped semiconductor, aluminum, copper, an aluminum/copper alloy, titanium, titanium nitride, tungsten, tantalum, doped polysilicon, or any other suitable material, e.g. an electrically conducting polymer or an electrically conducting organic material.

The board 100 may include at least one material of the following group of materials or may be formed of at least one material of the following group of materials: a laminate, a resin (e.g. a thermoset resin), a polymer, a metal (e.g. copper), epoxy, polyepoxides, a composite material (e.g. glass fiber reinforced polymers, e.g. FR-4 glass epoxy), polytetrafluoroethylene or any other suitable material, e.g. bismaleimide-triazine (BT). The board 100 may include a printed circuit board.

A wiring structure or a metallization structure (e.g. a via 112a, 112b, 112c or an electrical connection 108) may be formed by using for example electroplating or electro deposition and a subsequently performed patterning process including for example a masking process and an etch process. One or more vias (e.g. vias 112a, 112b, 112c) may be formed by providing one or more holes in the board or through the board, e.g. by laser drilling, mechanical drilling, or etching, and filling the one or more holes (e.g. the through hole) with an electrically conductive material, e.g. copper. A hole or through hole may be filled for example by plating, e.g. electroplating or electroless plating.

The thickness (the height) of a board (e.g. Board 100), e.g. the extension of the board along the direction 103, may be in the range from about several hundreds of micrometers to about several millimeters.

The lateral extension (the width) of board 100, e.g. the extension of the board 100 along the direction 101/105, may be in the range from about several millimeters up to several centimeters, e.g. in the range from about 5 mm to about 10 cm.

The one or more fan-out contact pads 106 may be configured to at least one of receive a test signal and provide a measurement signal, which means that the one or more fan-out contact pads 106 may for example allow the injection of a high current, e.g. up to several ampere, e.g. up to 20 A, e.g. up to 50 A. The current may be injected by discharging a charged transmission line into the one or more fan-out contact pads 106. Therefore, a current being conducted to the integrated circuit to be tested may increase within several nanoseconds (or microseconds). In other words a current pulse may be injected into the one or more fan-out contact pads 106 and via the wiring 108 into the integrated circuit 120 to be tested, as illustrated in FIG. 1D.

The contact pads 104a, 104b, 104c of the first set 104 of contact pads on the first side 100a of the board 100 and the contact pads 110a, 110b, 110c of the second set 110 of contact pads on the second side 100b of the board 100 may be arranged to provide a similar set of vias to connect the integrated circuit 120 under test with a test board, e.g. with a system verification board. The integrated circuit 120 under test may be electrically coupled with the board 100 by soldering the integrated circuit contact pads 122a, 122b, 122c to the corresponding contact pads 104a, 104b, 104c of the first set 104 of contact pads on the first side 100a of the board 100. Further, there may be other possibilities to electrically couple the integrated circuit 120 under test with the board 100, e.g. by using press contacts or by pressing the integrated circuit 120 under test on the board 100 and/or pressing the integrated circuit contact pads 122a, 122b, 122c on the corresponding contact pads 104a, 104b, 104c of the first set 104 of contact pads.

The board 100 (or the fan-out board 100) may provide access to the integrated circuit pins under test. The board 100 may provide test pads 106 to force the stress pulses (to perform an ESD test) into the integrated circuit under test, wherein the test pads 106 may be close to the integrated circuit pins (or integrated circuit contact pads) and may further allow to measure the current and voltage waveforms for example of the test signal and the response signal. The test pads 106 may be arranged so that both the voltage at, and the current into, an integrated circuit pin can be measured. The board 100 may be mounted removably on a test board (or a system verification board). Further the board 100 may be adapted to the specific integrated circuit under test. Therefore, using the board 100 (or fan-out board 100), as described herein, the verification board may not need to be altered to perform ESD tests (or ESD test of an active integrated circuit operated by a test board), which may reduce cost and may eliminate the risk of designing a second test board. Further, using the board 100 may allow the test pads 106 to be very close to the pins of the integrated circuit under test. Placing the pads to the test pads 106 on the test board (a system verification board (SVB)) would require them to be physically far away from the integrated circuit under test, resulting in less efficient and less accurate tests and measurements, e.g. due to parasitic effects of the wiring.

In the following, an integrated circuit testing arrangement 200 may be provided on the basis of the board 100 (or fan-out board 100) as described before referring to FIG. 1A to FIG. 1D. Therefore, the features and functionalities as described before referring to the board 100, may be included, or used in an extended and/or modified manner in the integrated circuit testing arrangement 200.

While a characterization method addressing hard fails (which may require a person with specialized knowledge before the device can be put back into operation or which may require a repair) may be provided, the analysis of soft fails of an integrated circuit or an electronic device may be more difficult. The analysis of a soft fail of an integrated circuit or an electronic device (which may be overcome without the assistance of a person with specialized knowledge or without repairing the electronic device or the integrated circuit, e.g. by restarting the device) may involve and/or may require that the integrated circuit or the electronic device may be operated in various states to find out the most sensitive case for a soft fail. The analysis of soft fails of an integrated circuit or electronic device may be realized by utilizing a test board or system verification board (SVB), e.g. running with regular firmware for the electronic device or the integrated circuit under test. ESD stress pulses, e.g. transmission line stress pulses, may be injected into the pin under test and the response of the system may be monitored. However, conventional system verification boards may not allow access to most of the pins that require testing and special access points have to be provided for stress forcing and monitoring.

An integrated circuit testing arrangement 200 may be provided including the board 100, as describe herein, providing an enhanced testing arrangement for an integrated circuit under test, e.g. for analyzing soft fails and/or characterizing the ESD properties.

Figure 2A:
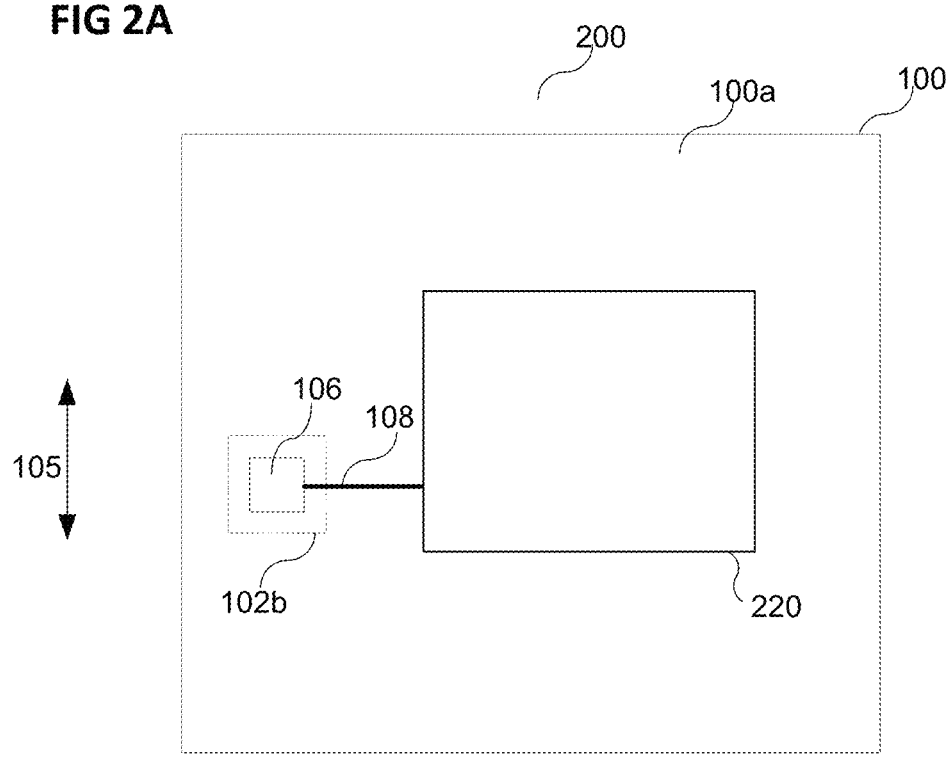
FIG. 2A schematically shows a top view of a board or fan-out board including an integrated circuit.
Figure 2B:
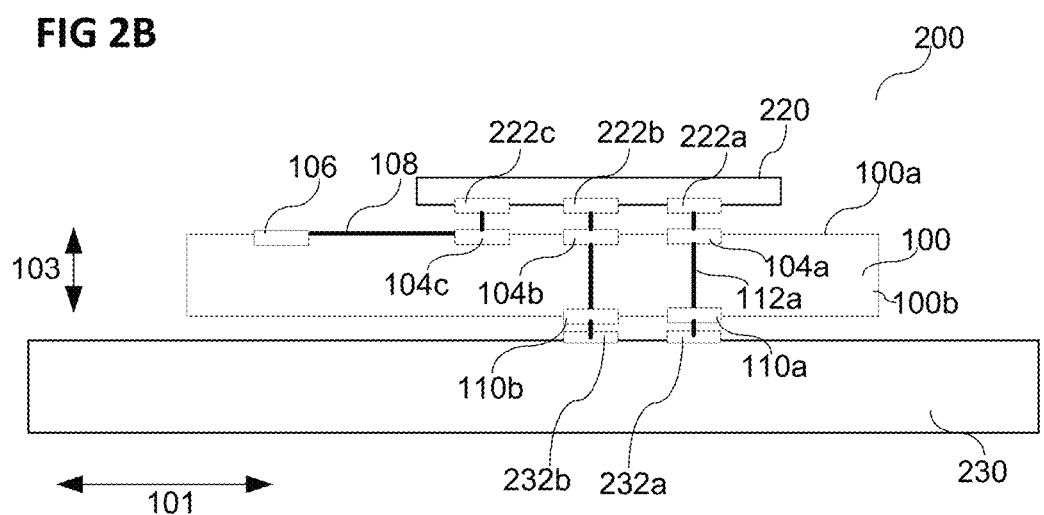
FIG. 2B schematically shows a side view or a cross sectional view of a board or fan-out board including an integrated circuit.
Figure 2C:
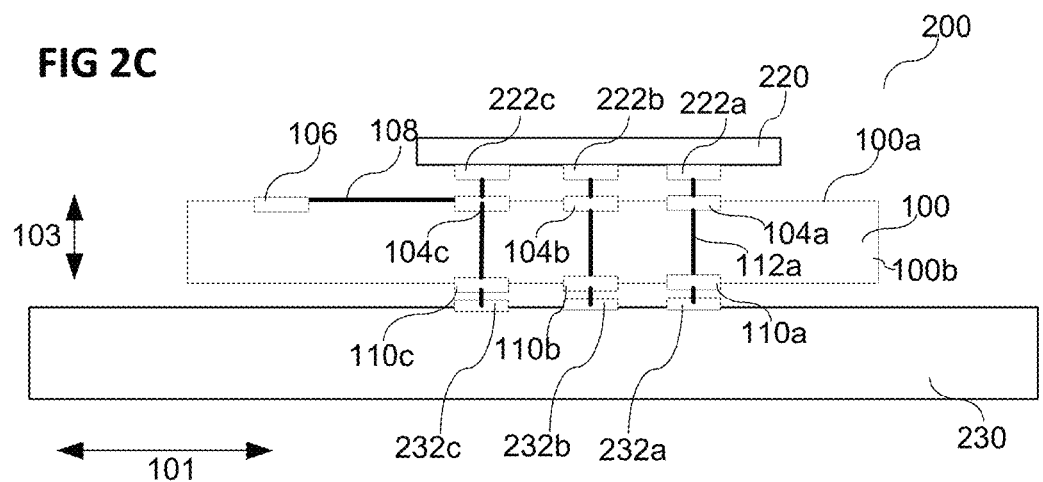
FIG. 2C schematically shows a side view or a cross sectional view of a board or fan-out board including an integrated circuit and a test board.

FIG. 2A and corresponding FIG. 2B and FIG. 2C illustrate an integrated circuit testing arrangement 200, including a fan-out board 100, as already described, an integrated circuit 220 under test, and a test board 230 (e.g. a system verification board 230).

An integrated circuit testing arrangement 200 may include an integrated circuit 220 under test including a plurality of integrated circuit contact pads 222 (e.g. including integrated circuit contact pads 222a, 222b, 222c); a test board 230 including a plurality of test board contact pads 232 (e.g. including test board contact pads 232a, 232b, 232c); and a fan-out board 100, as already described above.

The fan-out board may include a plurality of fan-out contact pads 106 (herein also referred to as test pads or contact pads to inject a TLP) including for example one or more injection contact pads and one or more probe contact pads. The plurality of fan-out contact pads 106, e.g. the one or more injection contact pads and the one or more probe contact pads, may be arranged on a first side 100a of the fan-out board 100 facing the integrated circuit 220. As already described, the integrated circuit 220 under test may be arranged on the first side 100a of the fan-out board 100, as shown for example in FIG. 2A. The integrated circuit 220 may have a plurality of integrated circuit contact pads 222 disposed on a surface of the integrated circuit 220 facing the fan-out board 100. Each contact pad of the plurality of integrated circuit contact pads 222 may be electrically conductively connected to a corresponding contact pad of the first set 104 of board contact pads arranged on the first side of the fan-out board 100. The integrated circuit contact pads 222a, 222b, 222c may electrically conductively connect to the corresponding board contact pad 104a, 104b, 104c, as illustrated in FIG. 2B. Further, at least one contact pad 222c of the plurality of the integrated circuit contact pads 222 may electrically connect to at least one contact pad 106 of the plurality of fan-out contact pads 106, via the corresponding board contact pad 104c and the wiring structure 108, as described above.

As shown in FIG. 2B, one or more contact pads 222a, 222b of the plurality of the integrated circuit contact pads 222 may electrically conductively connect to the corresponding test board contact pads 232a, 232b of the plurality of test board contact pads 232. The integrated circuit 220 under test may be operated by the test board 230 via the one or more integrated circuit contact pads 222a, 222b electrically conductively connecting to the test board 230.

The plurality of integrated circuit contact pads 222 may include a pin arrangement or a pin grid array (PGA) or ball grid array (BGA). One or more integrated circuit contact pads 222 may be soldered on the corresponding board contact pad of the first set 104 of board contact pads. The integrated circuit may be mounted on the fan-out board 100 by at least one of soldering and gluing. Further, the fan-out board 100 may be mounted on the test board 230 by at least one of soldering and gluing. One or more test board contact pads 232 may be soldered to the corresponding board contact pad of the second set 110 of board contact pads.

As shown in FIG. 2B and FIG. 2C, one or more or all contact pads of the plurality of integrated circuit contact pads 222 may be electrically coupled (e.g. soldered or glued) to the corresponding contact pad of the first set 104 of board contact pads. The contact pads of the first set 104 of board contact pads may be positioned to match the design of the integrated circuit contact pads 222 of the integrated circuit under test 220. The contact pads of the first set 104 of board contact pads may electrically conductively connect to the integrated circuit contact pads 222 of the integrated circuit under test 220 in an unambiguous assignment. Further, one or more or all contact pads of the second set 110 of board contact pads may electrically couple (e.g. soldered or glued) to the corresponding contact pad of the test board contact pads 232. The contact pads of the second set 110 of board contact pads may be positioned to match the design of the test board contact pads 232 of the test board 230. The contact pads of the second set 110 of board contact pads may electrically conductively connect to the test board contact pads 232 of the test board 230 in an unambiguous assignment.

One or more contact pads 104c of the first set 104 of board contact pads may electrically couple to one or more fan-out contact pads 106. One or more contact pads 104c of the first set 104 of board contact pads may electrically couple to one or more fan-out contact pads 106 and to at least one test board contact pad 232c of the plurality of test board contact pads 232.

As illustrated in FIG. 2A, the lateral extension (along at least one direction of the lateral directions 101, 105) of the fan-out board 100 may be larger than the lateral extension of the integrated circuit under test 220, e.g. to provide at least one fan-out region 102b, wherein one or more fan-out contact pads 106 may be arranged within the at least one fan-out region 102b.

The integrated circuit under test 220 may be mounted or arranged over the first side 100b of the fan-out board 100 and the test board 230 may be mounted or arranged over the second side 100b of the fan-out board 100. In other words, the fan-out board 100 may be arranged between the test board 230 and the integrated circuit under test 220. Therefore, the fan-out board 100 may provide an additional possibility besides the test board to inject a test signal into the integrated circuit under test 220. According to this, the test board 230 may be a system verification board 230 configured to enable the operation of the integrated circuit under test 220. The test board 230 may be further configured to perform at least a test of the integrated circuit under test 220.

The one or more fan-out contact pads 106 of the fan-out board 100 may electrically couple to an external testing device to provide test signals for testing the integrated circuit under test 220 while the integrated circuit under test 220 may be operated by the test board 230.

The fan-out board may be configured to inject one of a voltage and a current provided by the external testing device into at least one pin 222c (or integrated circuit contact pad 222c) of the integrated circuit under test 220. The fan-out board may be configured to inject an ESD test signal, e.g. a transmission line pulse, provided by the external testing device into at least one pin 222c (or integrated circuit contact pad 222c) of the integrated circuit under test 220. In other words, the fan-out board 100, e.g. the one or more fan-out contact pads 106, the wiring 108, the at least one board contact pad 104c of the first set 104 of board contact pads, and the electrical connection between the at least one board contact pad 104c of the first set 104 of board contact pads and the corresponding at least one integrated circuit contact pad 222c may allow to inject a high current (e.g. larger than about 1 A, e.g. larger than about 10 A, e.g. larger than about 20 A) within a short time (e.g. smaller than about 10 ms, e.g. smaller than about 1 ms, e.g. smaller than about 100 ns, e.g. smaller than about 10 ns, e.g. smaller than about 1 ns) into the integrated circuit 220. At the same time, the one or more fan-out contact pads 106 may allow the read out or detecting the response of the integrated circuit under test 220, after the ESD test signal has been injected. Since the wiring structure 108 may not be limited to a specific design, as it would be on the test board 230, the fan-out board 100 may be configured to provide an optimal wiring 108 for the ESD test measurements, e.g. the wiring 108 may be adapted to have a beneficial RLC behavior.

Figure 2D:
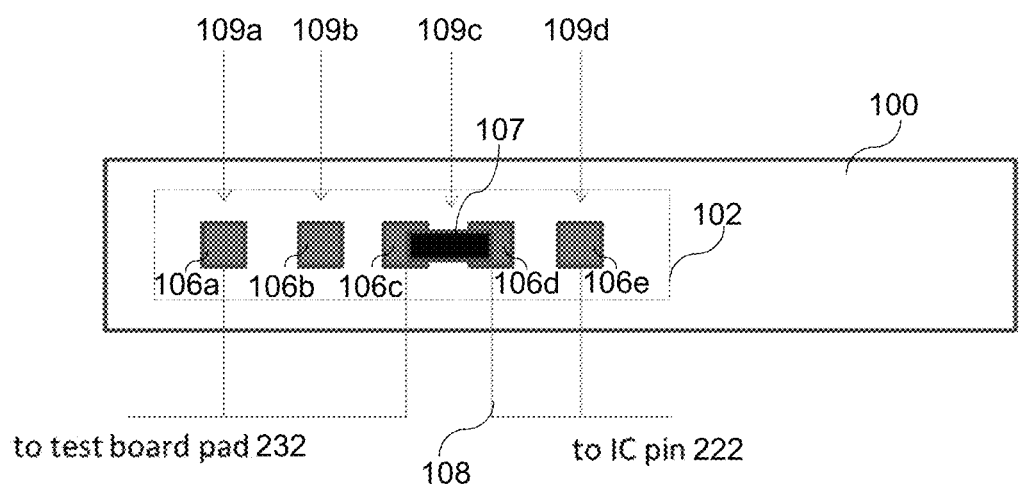
FIG. 2D schematically shows a top view of a board or fan-out board including a fan-out contact pad arrangement in a fan-out region.

As shown in FIG. 2D, the fan-out board 100 may include a plurality of fan-out contact pads 106a to 106e in a fan-out region 102b, which may allow current injection 109a at a first contact pad 106a of the fan-out contact pads, a connection to the ground 109b at a second contact pad 106b of the fan-out contact pads, current measurement 109c of the current being injected into the integrated circuit pin 222 (e.g. into at least one contact pad of the integrated circuit contact pads 222) at a third contact pad 106c and a fourth contact pad 106d of the fan-out contact pads, and capturing the voltage waveform 109d close to the integrated circuit pin at a fifth contact pad 106e of the fan-out contact pads.

The plurality of fan-out contact pads may be electrically coupled to an external testing device performing at least one of the current injection 109a, the current measurement 109c, and capturing the voltage waveform 109d. Further, the second contact pad 106b may be electrically coupled to the external testing device. The first fan-out contact pad 106a and the third fan-out contact pad 106c may be for example electrically coupled to the test board 230 and/or the test board contact pads 232. The fourth fan-out contact pad 106d and the fifth fan-out contact pad 106e may be electrically coupled to the integrated circuit and/or the integrated circuit contact pads 222.

The current injection 109a may include the injection of an ESD/TLP test signal. Further, the current measurement 109c may be performed over a resistor 107, e.g. a 5 k Ohm resistor 107, wherein the resistor 107 may be electrically connected with the third contact pad 106c and the fourth contact pad 106d of the fan-out contact pads.

A high amplitude ESD stress can directly be injected into the pin of the device under test, while the device under test is fully operational. An accurate current and voltage waveform at the pin can be extracted during the stress application. Further, the board arrangement 200 (integrated circuit testing arrangement 200) may reduce the interference between normal operation set-up (provided by the test board 230) and stress measurement set-up (provided by the fan-out board 100).

The integrated circuit contact pads 222 and/or the test board contact pads 232 may include at least one material of the following group of materials or may be formed of at least one material of the following group of materials: an electrically conducting material, a metal, a metallic material, a doped semiconductor, aluminum, copper, an aluminum/copper alloy, titanium, titanium nitride, tungsten, tantalum, doped polysilicon, gold, silver, nickel, a solder material, tin, indium, lead, or any other suitable material, e.g. an electrically conducting polymer or an electrically conducting organic material.

The test board 230 may include at least one material of the following group of materials or may be formed of at least one material of the following group of materials: a laminate, a resin (e.g. a thermoset resin), a polymer, a metal (e.g. copper), epoxy, polyepoxides, a composite material (e.g. glass fiber reinforced polymers, e.g. FR-4 glass epoxy), polytetrafluoroethylene or any other suitable material, e.g. bismaleimide-triazine (BT). The test board 230 may include a printed circuit board.

The integrated circuit under test may include or may consist of at least one of the following: one or more chips, one or more dies, a metallization structure, an electronic circuit, a logic circuit, a power circuit, capacitors, inductors, transistors, power electronics, and the like.

The lateral extension (the width) of the test board 230, e.g. the extension of the test board 230 along the direction 101/105, may be in the range from about several centimeters up to several tens of centimeters, e.g. in the range from about 1 cm to about 30 cm.

The test board 230 may include at least one of the following components: passive components, resistors, capacitors, coils, active components, transistors, a chip, a die, and the like. Further, the test board 230 may include one or more surface mounted components (SMC), one or more surface mounted packages (SMP) and/or one or more surface mount devices (SMD). Therefore, the fan-out board 100 may be arranged having a (e.g. predefined) distance to the test board 230.

In the following, modifications, enhancements, details, additional aspects and/or additional functionalities may be described referring to the integrated circuit testing arrangement 200 and to the fan-out board 100, as described before.

In order to properly characterize an integrated circuit 220 during normal operation a complete system (implementation of the end product) may be required. This may be realized by using a test board or a system verification board (SVB) being commonly implemented for software/firmware development examples (so called reference designs) by manufacturers in order to test the functionality of their integrated circuits. A system verification board 230 may be used for an ESD-induced soft failure characterization. An integrated circuit testing arrangement 200 may include a small number of boards (printed circuit boards) including at least one of a test board, a spacer board, a fan-out board, and optionally a conductive gasket (an interposer structure) to allow the fan-out board to be mounted removably.

FIG. 3A illustrates an integrated circuit testing arrangement 200 including an integrated circuit under test 220, a fan-out board 100, and a test board 230, as already described, and a spacer board 340. The spacer board 340 may lift the fan-out board 100 above the height of one or more nearby components 348a (SMD, SMC, SMP) of the test board 230 being arranged in a region 348. The spacer board 340 may have a thickness in the range from about several hundreds of micrometers to about several millimeters, e.g. in the range from about 500 µm to about 10 mm, e.g. in the range from about 0.5 mm to about 2 mm.

The spacer board 340 may include at least one material of the following group of materials or may be formed of at least one material of the following group of materials: a laminate, a resin (e.g. a thermoset resin), a polymer, a metal (e.g. copper), epoxy, polyepoxides, a composite material (e.g. glass fiber reinforced polymers, e.g. FR-4 glass epoxy), polytetrafluoroethylene or any other suitable material, e.g. bismaleimide-triazine (BT).

The spacer board 340 may include a plurality of spacer board contact pads and/or a plurality of vias. The spacer board 340 may be configured to mount the fan-out board 100 on the test board 230 and providing the necessary electrically conductively connection between the second set 110 of contact pads of the fan-out board 100 and the plurality of test board contact pads 232 of the test board 230.

The spacer board 340 may include a set of vias 342 (e.g. including a plurality of vias 342a, 342b, 342c) that electrically connect a first set 344 of spacer board contact pads (e.g. including a plurality of spacer board contact pads 344a, 344b, 344c arranged on a first side 340a of the spacer board 340) to a second set 346 of spacer board contact pads (e.g. including a plurality of spacer board contact pads 346a, 346b, 346c arranged on a second side 340b of the spacer board 340). The first side 340a of the spacer board 340 may be the top surface of the spacer board and the second side 340b of the spacer board 340 may be the bottom surface of the spacer board. The first side 340a and the second side 340b of the spacer board 340 may be opposite sides of the spacer board 340.

The spacer board 340 may be sufficiently large to mount the fan-out board 100 on top of, without the risk of a collision between surrounding components on the test board 230. Once constructed, the spacer board 340 may be soldered directly to the test board 230, providing a rigid platform on which to base the rest of the test stack, e.g. the fan-out board 100, e.g. the integrated circuit under test 220, and, as shown later, e.g. a conductive gasket.

As illustrated in FIG. 3B, the spacer board 340 may route the electrical connection between the integrated circuit under test 220 and the test board 230, as described herein. The fan-out board 100 and the spacer board 340 may be connected with each other, e.g. glued or soldered. The spacer board 340 may be a part of the fan-out board 100, e.g. formed in one piece, or may be a part of the test board 230, e.g. formed in one piece.

The spacer board 340 may provide at least a part of the electrical connection 350a, 350b, 350c between the integrated circuit contact pads 304a, 304b, 304c and the test board contact pads 232a, 232b, 232c.

The lateral extension (along at least one direction of the lateral directions 101, 105) of the spacer board 340 (or a spacer region being formed on a test board 230 or on a fan-out board 100) may be smaller than the lateral extension of the fan-out board 100, so that the use of the fan-out board 100 may be less space consuming due to mounting the fan-out board 100 on the spacer board 340 to provide space 348 for surface mounted components on the test board 230.

The spacer board 340 may allow mounting the fan-out board 100 on a readily manufactured test board 230, since the spacer board 340 may have substantially the same lateral extension than the integrated circuit, wherein the test board 230 may be originally designed and manufactured and thus, the integrated circuit can be mounted directly on the test board 100. In other words, the spacer board 340 may be mounted on the test board 230 instead of the integrated circuit and providing a basis for mounting the fan-out board 100 on the test board 230.

At least one of the vias 342 and the spacer board contact pads 344, 346 may be formed by providing a hole in the board or through the board, e.g. by laser drilling, mechanical drilling, or etching, and filling the hole (e.g. the through hole) with an electrically conductive material, e.g. copper. The hole or through hole may be filled by plating, e.g. electroplating or electroless plating.

Figure 3C:
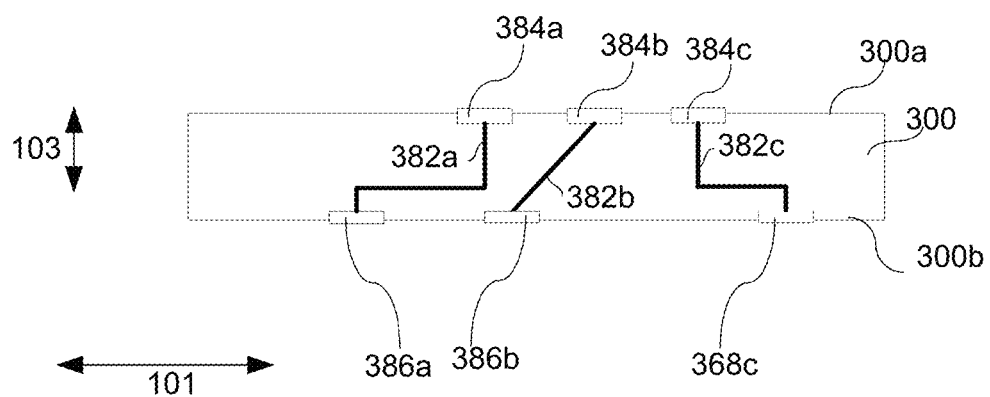
FIG. 3C and FIG. 3D respectively show a schematic side view or a schematic cross sectional view of board including at least one of a wiring structure and contact pads.

A board, e.g. a spacer board, a fan-out board or an interposer structure, as described herein, may include at least one contact pad on the top side of the board and one contact pad at the bottom side of the board. The contact pad on the top side of the board may be electrically conductively connected with the contact pad at the bottom side of the board. As shown in FIG. 3C, a contact pad 384a, 384b, 384c on a top side 300a of a board 300 may electrically conductively connect via a connection structure 382a, 382b, 382c with a contact pad 386a, 386b, 386c at a bottom side 300b of a board 300. As shown in FIG. 3C, the connection structure 382a, 382b, 382c may be a wiring structure provided at least one of over and in the board 300, e.g. including an electrically conductive routing structure. Therefore, the board 300 may be configured to provide different layouts (or positions) of the contacts pads on the top side 300a of a board 300 and on the bottom side 300b of a board 300.

Figure 3D:
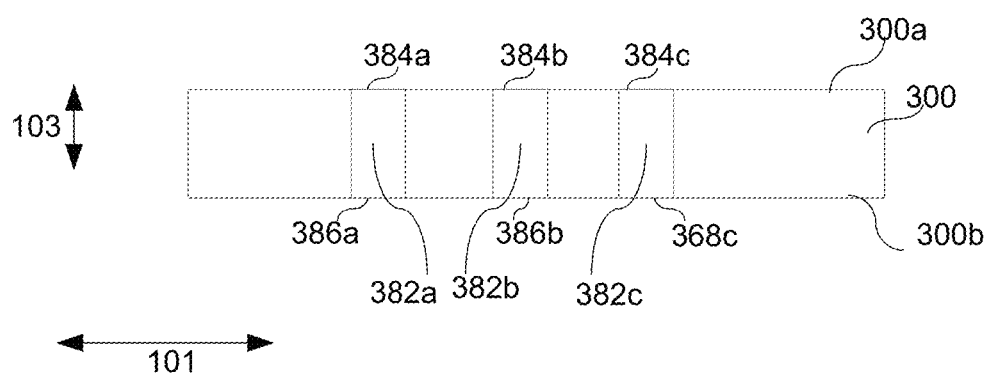

As shown in FIG. 3D, the contact pads 384a, 384b, 384c on the top side 300a of a board 300 and the contact pads 386a, 386b, 386c on the bottom side 300b of the board 300 may be a part of or may be provided by the connection structure 382a, 382b, 382c. The connection structure 382a, 382b, 382c may include through vias extending from the first side 300a of the board 300 to the second side 300b of the board 300, wherein the upper surfaces 384a, 384b, 384c of the through vias 382a, 382b, 382c on the top side 300a of the board 300 and the bottom surfaces 386a, 386b, 386c of the through vias 382a, 382b, 382c at the bottom side 300b of the board 300 may provide the respective contact pads. Therefore, the positions of the contact pads on the top side 300a of the board 300 may match inherently to the positions of the board contact pads on the bottom side 300b of the board 300.

The positions of contact pads being arranged on different sides of a board (e.g. on opposite sides of a spacer board, a fan-out board or an interposer structure) may described therein to match, if the contact pads are coextensively arranged (or substantially coextensive or overlapping) on the respective sides of the board referring to the top view, e.g. seen from direction 103 or from a direction perpendicular to the surface of the board on which the contact pads are arranged.

The positions of contact pads being arranged on different components (e.g. on different boards or on a board and on an integrated circuit, or interposer structure) may match, if the contact pads are coextensively arranged (or substantially coextensive or overlapping) on the respective surfaces referring to the top view, e.g. seen from direction 103 or from a direction perpendicular to the surface of the board on which the contact pads are arranged.

To provide the necessary electrical connection between the test board 230 and the spacer board 340, the positions of the test board contact pads 232 may match the positions of the second set 346 of spacer board contact pads being arranged on the bottom side 340b of the spacer board 340. To provide the necessary electrical connection between the spacer board 340 and the fan-out board 100, the positions of the contact pads of the first set 344 of spacer board contact pads being arranged on the top side 340a of the spacer board 340 may match the positions of the contact pads of the second set 110 of board contact pads being arranged on the bottom side 100b of the fan-out board 100. To provide the electrical connection between the fan-out board 100 and the integrated circuit under test 220, the positions of the contact pads of the first set 110 of board contact pads being arranged on the top side 100a of the fan-out board 100 may match the positions of the integrated circuit contact pads 222 of the integrated circuit under test 220.

A spacer board 340 and a fan-out board 100 may be used to route the interconnections between the contact pads, e.g. between contact pads being arranged on different sides or surfaces of the board. Therefore, the board may include a metal conductor or a wiring structure that can provide the electrical connections. The traces or lines may be etched from a copper foil (or layer) or an aluminum foil (or layer) which may be bonded to one or more laminates of the board. A board may have one or more layers including for example metal planes, traces or lines that are interconnected to each other by through-hole plated vias.

The fan-out board may be connected removably with the spacer board or with the test board, e.g. instead of gluing or soldering the fan-out board to the spacer board or to the test board. Therefore, a flexible interposer structure may be utilized providing the electrical connection between the fan-out board and the spacer board or between the fan-out board and the test board.

A soft interposer (e.g. an electronic gasket) may be used. To mechanically fix the fan-out board on the test board, the test board may include an alignment structure and a fixture to mechanical fix the fan-out board. An interposer may be understood as an intermediate layer providing the necessary or desired electrical routing; and the interposer may be a soft interposer including a flexible material, e.g. a polymer.

Figure 3E:
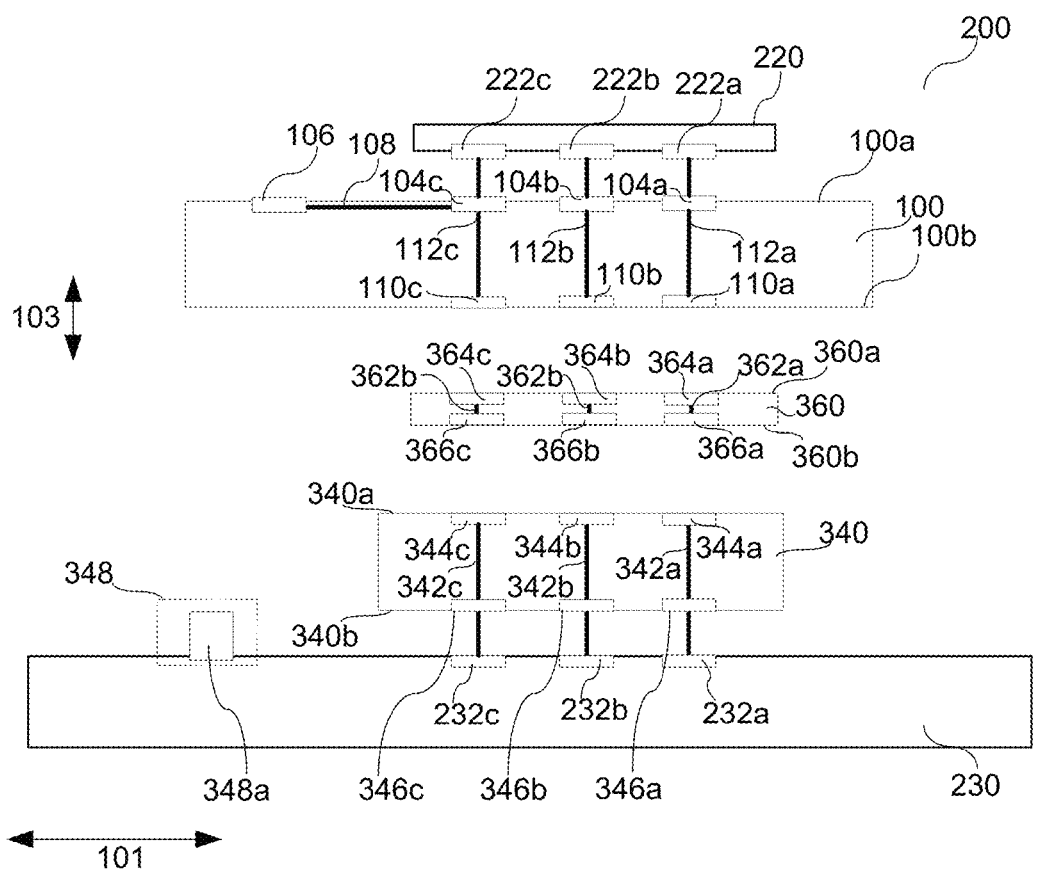
FIG. 3E shows a schematic side view or a schematic cross sectional view of an integrated circuit testing arrangement including an interposer structure.

As illustrated in FIG. 3E, an interposer structure 360 may be arranged between the fan-out board 100 and the spacer board 340. Therefore, the fan-out board 100 may be removably connected with the test board 230, so that the integrated circuit under test 220 may be operated by the test board 230.

The interposer structure 360 may include a wiring structure to provide the electrical connection between the fan-out board 100 arranged on a first side 360a of the interposer structure 360 and the spacer board 340 arranged on a second side 360b of the interposer structure 360. The wiring structure of the interposer structure 360 may include a plurality of electrical connections or vias 362 (e.g. including the electrical connections or vias 362a, 362b, 362c), a first set 364 of interposer structure contact pads arranged on a first side 360a of the interposer structure 360 (e.g. including the interposer structure contact pads 364a, 364b, 364c) facing towards the fan-out board 100 and a second set 366 of spacer board contact pads arranged on a second side 360b of the interposer structure 360 (e.g. including the interposer structure contact pads 366a, 366b, 366c) facing towards the spacer board 340.

The positions of the contact pads of the first set 364 of interposer structure contact pads arranged on a first side 360a of the interposer structure 360 may match to the positions of the contact pads of the second set 110 of board contact pads arranged on the second side 100b or the fan-out board 100 (e.g. including the board contact pads 110a, 110b, 110c). The positions of the contact pads of the second set 366 of interposer structure contact pads arranged on a second side 360b of the interposer structure 360 may match to the positions of the contact pads of the first set 344 of spacer board contact pads (e.g. including the spacer board contact pads 344a, 344b, 344c).

A plurality of vias (e.g. including the vias 362a, 362b, 362c) may extend from the first side 360a of the interposer structure 360 to the second side 360b of the interposer structure 360 electrically connecting each contact pad of the first set 364 of interposer structure contact pads to the respective contact pad of the second set 366 of interposer structure contact pads.

The interposer structure 360 may include a flexible body, e.g. a gasket, including for example a polymer material, and a plurality of through vias, wherein the vias may provide the desired electrical connection between the fan-out board 100 mounted on the first side 360a of the interposer structure 360 and the spacer board 340 mounted on the second side 360b of the interposer structure 360.

Since the interposer structure 360 may be flexible, the interposer structure 360 may absorb mechanical stress, e.g. during mounting the integrated circuit under test on the fan-out board 100 or during mounting the fan-out board 100 on the spacer board 340 or on the test board 230. Therefore, the flexible interposer structure 360 may enhance the lifetime of the integrated circuit testing arrangement 200. Further, the interposer structure 360 may allow to mount the fan-out board 100 removably on the spacer board 340 or on the test board 230.

Figure 4:
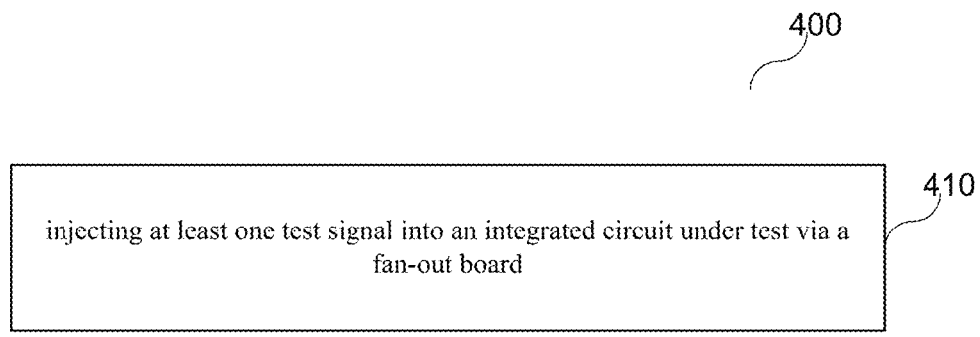
FIG. 4 shows schematically a flow diagram of a method for operating an integrated circuit.

FIG. 4 shows schematically an exemplary flow diagram of a method for operating and/or testing an integrated circuit. A method 400 for testing an integrated circuit may include: in 410, injecting at least one test signal into an integrated circuit under test 220 via a fan-out board 100. Referring to this, the fan-out board 100 used for performing method 400 may include a first set 104 of board contact pads arranged on a first side 100a of the fan-out board 100, the first set 104 of board contact pads electrically connecting to the integrated circuit contact pads 222 of the integrated circuit under test 220; a fan-out region 102b on the first side of the fan-out board, the fan-out region 102b may include one or more fan-out contact pads 106 configured to at least one of receive a test signal and provide a measurement signal; wherein at least one contact pad of the one or more fan-out contact pads 106 may electrically conductively connect to at least one contact pad of the first set 104 of board contact pads; and a second set 110 of board contact pads on a second side 110b of the fan-out board 100, the second set 110 of board contact pads configured to electrically connect to test board contact pads 232 of a test board 230, wherein at least one contact pad of the second set 110 of board contact pads electrically conductively connects to at least one contact pad of the first set 104 of board contact pads.

Injecting at least one test signal into an integrated circuit under test 220 via a fan-out board 100 may include injecting at least one test signal into the test pads 106 of the fan-out board 100, the fan-out board 100 may be included in an integrated circuit testing arrangement 200. Injecting a test signal may include to force stress pulses into the device under test, e.g. into the integrated circuit under test. The test signal may be injected close to the integrated circuit pins 222.

The method 400 for testing an integrated circuit 220 may further include measuring a current and a voltage waveform, e.g. the response of the integrated circuit under test to the test signal. Further, measuring a current and/or a voltage waveform may include measuring both the voltage at, and the current into, the integrated circuit pin (e.g. integrated circuit contact pad 222c) can be measured. The method 400 may allow testing the integrated circuit under test 220 by using the test pads 106 being close to the pins 222, whereas placing them on the system verification board 230 would require them to be physically further away from the integrated circuit under test 220. The fan-out board 100 may be used as form factor board. The fan-out board 100 may be configured such that the fan-out board 100 can be easily replaced, e.g. if the fan-out board 100 gets damaged during an ESD test.

The method 400 for testing an integrated circuit 220 may further include automated monitoring of functional states of the integrated circuit under test 220 and detecting a fail of the integrated circuit under test 220. Operating a functional state of the integrated circuit under test 220 may include at least one of the following: operating video, operating audio, operating Bluetooth/WIFI functions, operating FM-receiver, operating keypad, operating camera, e.g. operating MIPI (mobile industry processor interface), operating multimedia card, operating universal serial bus (USB, USIF).

The method 400 for testing an integrated circuit 220 may further include selecting a most critical state of system operation for pulse stress. The method 400 for testing an integrated circuit 220 may further include extracting a failure model for the pin under test.

The method 400 for testing an integrated circuit 220 may further include operating the integrated circuit under test 220 via the test board 230, wherein the test board 230 may be electrically connected to the second set 110 of board contact pads of the fan-out board 100.

Injecting at least one test signal into the integrated circuit under test 220 may include injecting at least one test signal via at least one contact pad 106 of the one or more fan-out contact pads 106.

Injecting at least one signal into the integrated circuit under test 220 may include injecting a transmission line pulse as an electrostatic discharge stress signal.

The method 400 for testing an integrated circuit 220 may further include detecting a test signal from the integrated circuit via at least one contact pad 106 of the one or more fan-out contact pads 106.

The fan-out board 100 may provide access to at least one pin 222 (or integrated circuit contact pad 222) correlated to at least one of the following functions of the integrated circuit under test 220: Bluetooth/WIFI, FM-receiver, keypad, camera (MIPI), multimedia card (e.g. a secure digital memory card), universal serial bus (USB, USIF).

Injecting at least one signal into the integrated circuit under test 220 may include injecting a transmission line pulse into at least one pin 222 (or integrated circuit contact pad 222) correlated to at least one of the following functions of the integrated circuit under test 220: Bluetooth/WIFI, FM-receiver, keypad, camera (MIPI), multimedia card (e.g. a secure digital memory card), universal serial bus (USB, USIF).

Detecting a test signal from the integrated circuit under test may include detecting the voltage waveform of a voltage signal of the integrated circuit.

The method 400 for testing an integrated circuit 220 may further include monitoring one or more functional states of the integrated circuit under test operated by the test board and detecting a failure if a failure occurs.

The method 400 for testing an integrated circuit 220 may further include extracting a failure model for the integrated circuit under test 220 base on at least one detected test signal.

The method 400 for testing an integrated circuit 220 may further include selecting the most critical functional state of the integrated circuit under test in correlation with the injected at least one test signal.

A test signal (an ESD pulse) may be injected into the device under test 220 (integrated circuit 220) wherein the device under test 220 may be operated in at least one functional state of the device under test 220. In other words, the device under test 220 may be operated as usual including the functions provided with the device under test 220, wherein one or more test signals may be injected into one or more pins of the device under test 220. There may allow correlating the soft failures introduced by the test signal with the functional state of the device under test 220.

As a result, as described above, the fan-out board 100 may allow in interaction with the test board 230 (a system verification board) introducing ESD test signals into the desired pin of the device under test 220. Further, the fan-out board 100 may allow in interaction with the test board 230 (a system verification board) correlating soft failures introduced by the test signal with the functional state of the device under test 220, since the device under test 220 may be operated in a functional state while the ESD test signal is injected.

Figure 5:
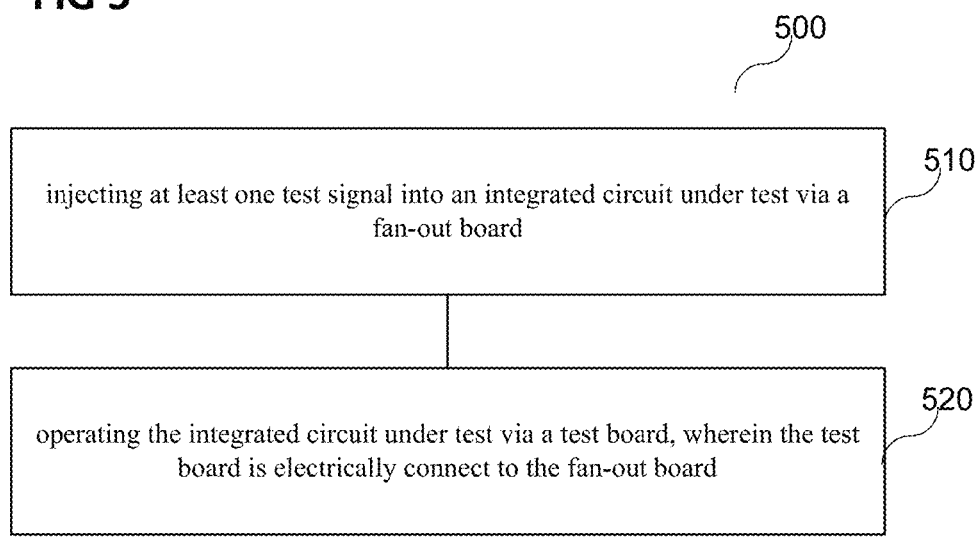

FIG. 5 and FIG. 6 show respectively a flow diagram of a method 500 and 600 for testing an integrated circuit. A method 500 for testing an integrated circuit 220 may include: in 510, injecting at least one test signal into an integrated circuit under test 220 via a fan-out board 100; and, in 520, operating the integrated circuit under test 220 via a test board 230, wherein the test board 230 is electrically connect to the fan-out board 100. Both processes 510, 520 of method 500 may be performed simultaneously.

A method 600 for testing an integrated circuit 220 may include: in 610, injecting at least one test signal into an integrated circuit under test 220 via a fan-out board 100; in 620, operating the integrated circuit under test 220 via a test board 230, wherein the test board 230 is electrically connect to the fan-out board 100; in 630, detecting a test signal from the integrated circuit under test 220 via at least one contact pad 106 of the one or more fan-out contact pads 106; in 640, monitoring one or more functional states of the integrated circuit under test 220 operated by the test board 230 and detecting a failure if a failure occurs; in 650, selecting the most critical functional state of the integrated circuit under test 220 in correlation with the injected at least one test signal; and, in 660, extracting a failure model for the integrated circuit under test 220 base on at least one detected test signal. Both processes 610, 620 of method 600 may be performed simultaneously.

Detecting a test signal may include measuring the current and the voltage generated from the integrated circuit under test 220 in response to the injected ESD test signal. Detecting a test signal may include analyzing the voltage waveform of a response signal from the integrated circuit under test 220. Detecting a test signal may include analyzing the current waveform of a response signal from the integrated circuit under test 220.

Figure 7A:
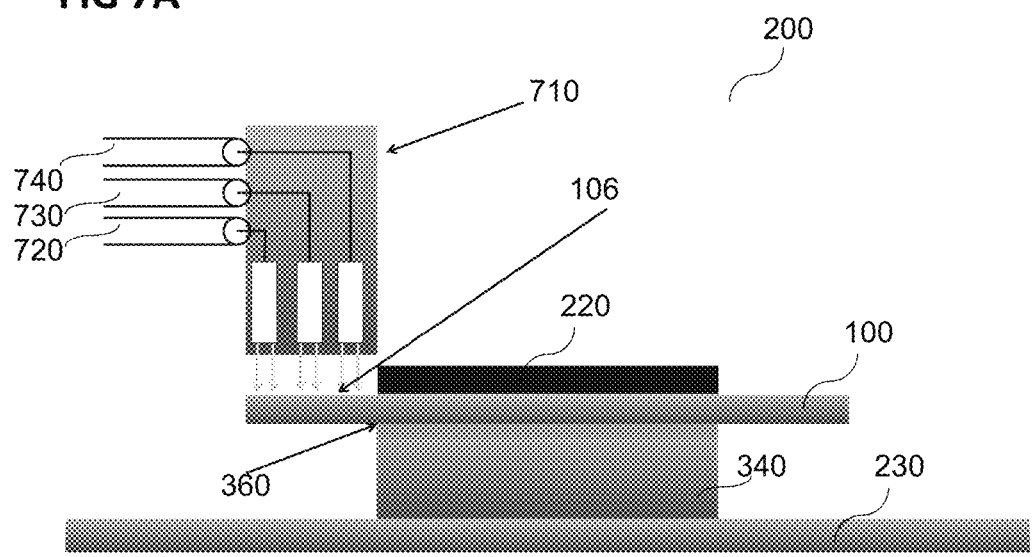
FIG. 7A schematically shows a side view or a cross sectional view of an integrated circuit testing arrangement.
Figure 7B:
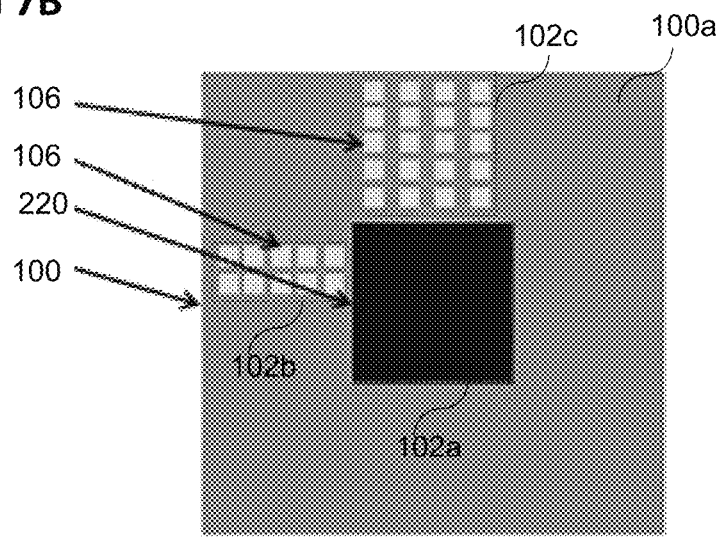
FIG. 7B schematically shows a top view of an integrated circuit testing arrangement.

FIG. 7A and FIG. 7B show an integrated circuit testing arrangement 200 in a side view and a fan-out board 100 in a top view. The integrated circuit testing arrangement 200 may include: a system verification board 230, a spacer board 340 coupled and electrically connected to the system verification board 230, a fan-out board 100 coupled and electrically connected to the spacer board 340 (and therefore also to the system verification board 230), an integrated circuit under test 220 coupled and electrically connected to the fan-out board 100 (and therefore also to the system verification board 230), wherein the integrated circuit under test 220 may be further electrically connected to an external testing device 710 via at least one fan-out contact pad 106 on the fan-out board 100 and a wiring structure 108 electrically connecting the least one fan-out contact pad 106 with at least one pin 222 of the integrated circuit under test 220.

At least one ESD test signal 720, e.g. a TLP, may be injected into the fan-out contact pads 106 by using the external testing device 710. Further, the external testing device 710 may be used to measure the voltage 730 and the current 740 injected into at least one pin of the integrated circuit under test and/or the voltage 730 and the current 740 generated from the integrated circuit under test 220 in response to the ESD test signal 720. The system verification board 230 may detect a failure of the integrated circuit under test 220 due to the injected ESD test signal 720, wherein the failure may be correlated with the respective functional state of the integrated circuit under test 220 being operated by the system verification board 230.

Figure 7C:
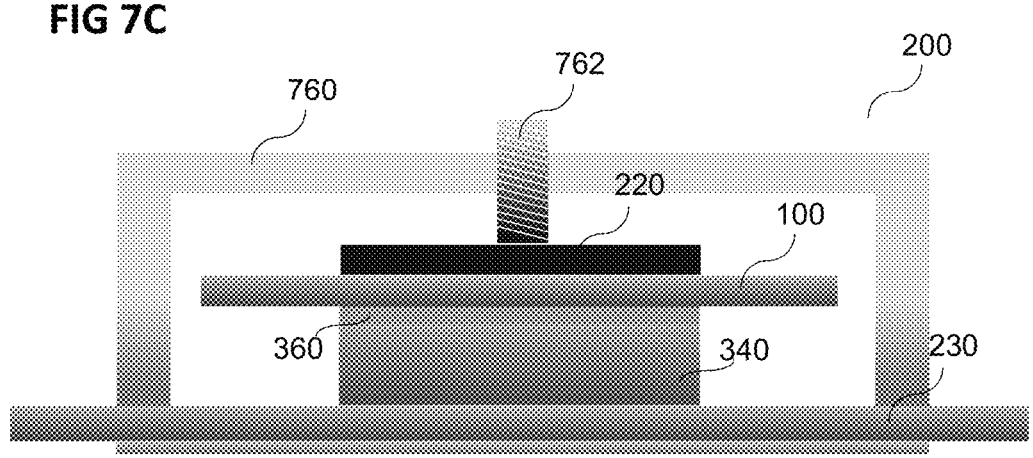
FIG. 7C schematically shows a side view or a cross sectional view of an integrated circuit testing arrangement.

The integrated circuit testing arrangement 200 may further include a soft interposer 360 to mount the fan-out board 100 containing the test pads 106 removably on the spacer board 340 or on the system verification board 230, as shown in FIG. 7C in more detail. The fan-out board 100 may be coupled to regular PCB landing pads 222 of the integrated circuit under test 220.

The test pads 106 may be arranged on an upper surface 100a of the fan-out board 100 so that both the voltage at, and the current into, the integrated circuit pin can be measured. The advantage may be that the verification board does not need to be altered to perform these tests, which reduces cost and eliminates the risk of designing a second board. This method may also allow the test pads 106 to be very close to the pins 222, whereas placing them on the system verification board 230 would require them to be physically far away from the integrated circuit under test 220. The interposer stack may be also be used for form factor board. It may be easily replaced if it gets damaged during an ESD/TLP stress.

An external testing device may be connected to the fan-out contact pads 106 of the fan-out board 100 by a test probe 710 (e.g. a monolithic test probe). The test probe 710 may be connected to the fan-out board 100 via so-called pogo pins (spring contact probes).

As shown in FIG. 7B, the fan-out board 100 may include more than one fan-out regions 102b, 102c. The fan-out board 100 may include two, three, four, five, six, seven, eight, nine, ten, or even more than ten fan-out regions. The integrated circuit under test (or the integrated circuit to be tested) may be mounted on the fan-out board 100 in an integrated circuit region 102a.

The integrated circuit testing arrangement 200 shown in FIG. 7A to FIG. 7C may include the features and functionalities as described above.

The stack, including the system verification board 230, the spacer board 340, the fan-out board 100 and the integrated circuit under test 220 (optionally the interposer structure 360) may be configured at least one of soldered and replaceable. To provide a replaceable stack, the probing system 200 (integrated circuit testing arrangement 200) may include a conductive gasket 360 or a flexible interposer 360 that may be manufactured to have the same pin layout as the integrated circuit under test and can be placed on top of the spacer 340. This flexible interposer 360 may be used to provide electrical connectivity between the spacer board 340 and the fan-out board 100. If this is not feasible, or a replaceable stack is not required, the fan-out board may be soldered directly to the spacer 340. In a flexible setup the fan-out board 100 may be aligned to the conductive gasket 360 and the spacer board 340 by a mechanical holder.

FIG. 7C shows an integrated circuit testing arrangement 200 in a modification including a flexible interposer structure 360, e.g. a partially electrically conductive gasket, being arranged between the fan-out board 100 and the spacer board 340. The integrated circuit testing arrangement 200 may further include a mechanical holder 760 to align the fan-out board 100 on the spacer board 340 with the interposer structure 360 in between. The fan-out board 100 and the spacer board 340 may include contact pads including solder balls, (e.g. a BGA) and thus, the fan-out board 100 may be electrically conductively connected to the spacer board 340 via the interposer structure 360.

The mechanical holder 760 may be used as alignment structure and as mechanical fixture. The mechanical holder 760 may include aluminum frame or steel frame, wherein the aluminum frame or steel frame may be arranged around the fan-out board 100. The frame 760 may be screwed or inserted into the system verification board 230.

A padded screw clamp 762 may be arranged at the mechanical holder 760 to apply for example a pressure on the center of the integrated circuit 220, forcing even compression across the fan-out board 100 and/or the spacer board 340.

The integrated circuit testing arrangement 200 may include mechanical holder 760 or a retention bracket 760. At least part of the mechanical holder 760 may be a retention bracket. The mechanical holder 760 may further include a screw-type terminal 762 and/or a clamp or a screw-type clamp structure to provide a mechanical pressure on the integrated circuit testing arrangement 200 to fix the fan-out board 100 on the system verification board 230 (or on the spacer board 340).

Figure 8:
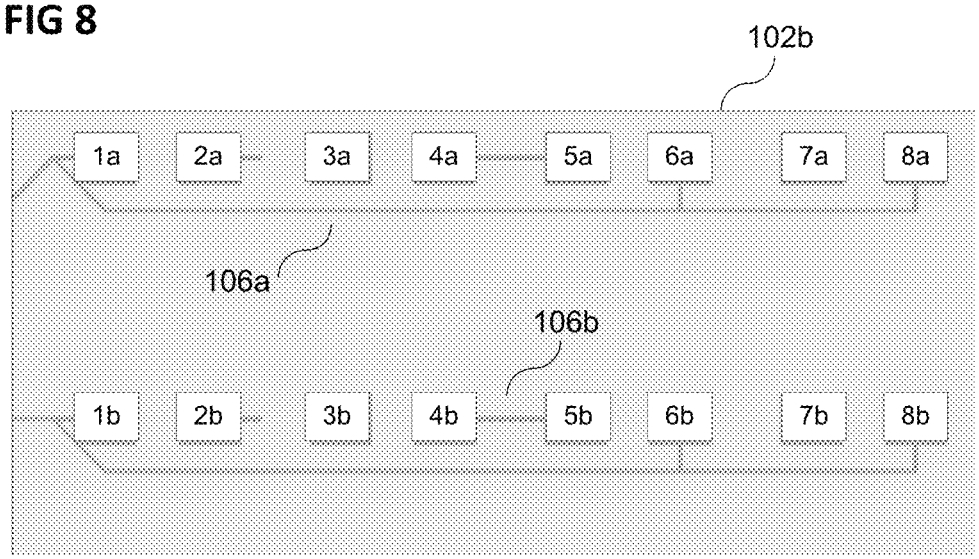
FIG. 8 schematically shows a top view of a fan-out region on a board or fan-out board.

As shown in FIG. 8, for each pin of the integrated circuit under test 220 the fan-out board 100 may include a series 106a, 106b of fan-out pads (e.g. fan-out pads 1a to 8a, fan-out pads 1b to 8b) for at least one of a transmission line injection, a voltage measurement, and a current measurement. Further, the board 100 may include a set 106a, 106b of fan-out contact pads and at least a resistor electrically connected to at least part of the fan-out contact pads 106, wherein the resistor may be capable of being probed via either magnetic field probe or voltage measurement probe to detect the current waveform through the resistor. The resistor may electrically connect to at least two fan-out contact pads of the respective set 106a, 106b of fan-out contact pads. Further, at least one contact pad of the respective set 106a, 106b of fan-out contact pads may be configured and/or arranged such that a shunt voltage probe can be placed very close to the integrated circuit pin, allowing voltage measurements to be performed at the pin directly. Further, at least two fan-out contact pads of the respective set 106a, 106b of fan-out contact pads may be configured and/or arranged to allow an external measurement device 710 to inject one or more ESD test signals into the integrated circuit under test through either the current sensing resistor (and subsequently the integrated circuit) or back into the rest of the system.

The plurality of fan-out contact pads 106 (e.g. the sets 106a, 106b of fan-out contact pads shown in FIG. 8) may include at least one of the following: two corresponding zero-ohm substitution probe pads (1a, 2a or 1b, 2b), two corresponding voltage probe pads (3a, 4a or 3b, 4b), two corresponding resistor pads (5a, 6a or 5b, 6b) (e.g. contacting a 5 k Ohm resistor), two corresponding TLP injection pads (7a, 8a or 7b,8b). The respective four corresponding contact pads may be surface-mount technology (SMT) pads. The respective four corresponding contact pads may be in a consistent configuration to enable a landing of a single monolithic probe on each test site. The TLP injection pads may be kept away from the measurement pads. The respective four corresponding contact pads may be connected to one pin 222 of the integrated circuit under test 220.

Figure 9:
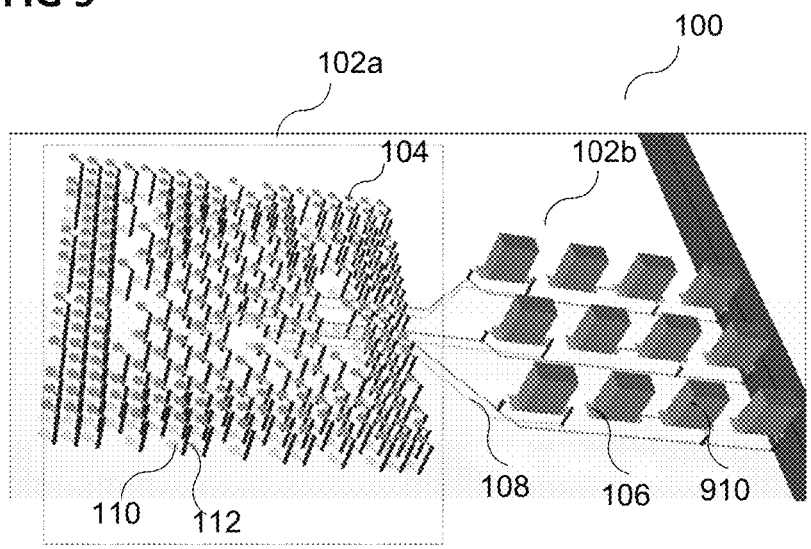
FIG. 9 schematically shows a perspective view of a board or fan-out board.

FIG. 9 shows exemplarily a fan-out board 100 in a schematic view having an integrated circuit region 102 including a first set of board contact pads 104 to connect to an integrated circuit under test, a second set of board contact pads 110 to connect to a system verification board 230 operating an integrated circuit under test connected to the fan-out board 100, and a plurality of fan-out contact pads 106 in a fan-out region 102b electrically connecting (e.g. via the wiring structure 108) to the board contact pads 104, 110 to at least inject an ESD test signal into the integrated circuit under test being connected to the board contact pads 104, 110. The board contact pads 104, 110 may be electrically connected with each other, e.g. by a corresponding set of vias 112. At least one fan-out contact pad 106 may be electrically coupled to a resistor 910. The resistor 910 may have a specific electrical resistance which may allow determining the current flowing through the resistor 910 by measuring the voltage drop over the resistor 910. The resistor 910 may be probed by using a hall sensor or an electromagnetic field detector (e.g. coils of specific form factor) to determine the current flow in the wiring of the fan-out board 100. Further, the resistor 910 may protect the external measurement system 710 of over voltage or a high current pulse injection damaging the external measurement system 710. Also inductive current probes may be used, if the resistor 910 is for example replaced by a wire loop.

The wiring 108 in the fan-out board 100 connecting the fan-out contact pads 106 with the board contact pads 104, 110 may be a multi-level wiring 108.

An integrated circuit 220 may be disposed on the top side of the fan-out board 100, wherein a selected number of pins of the integrated circuit may electrically conductively connect each to a multitude (e.g. at least 2) of test pads 106, e.g. 4 test pads 106 or 8 test pads 106. The test pads 106 may be arranged in a way that they may allow forcing of TLP pulses into the integrated circuit and the measurement of voltage and current at the integrated circuit pin at the same time. All test pads 106 may be exposed on the top side 100a of the fan-out board 100. Further-on, the traces of the pins under investigation may be routed from the test pads 106 to bottom balls/pins 110 in a way that the bottom balls/pins 110 are compatible to a landing pad arrangement 232 on the standard board 230 (system verification board 230, final system board 230).

Figure 10:
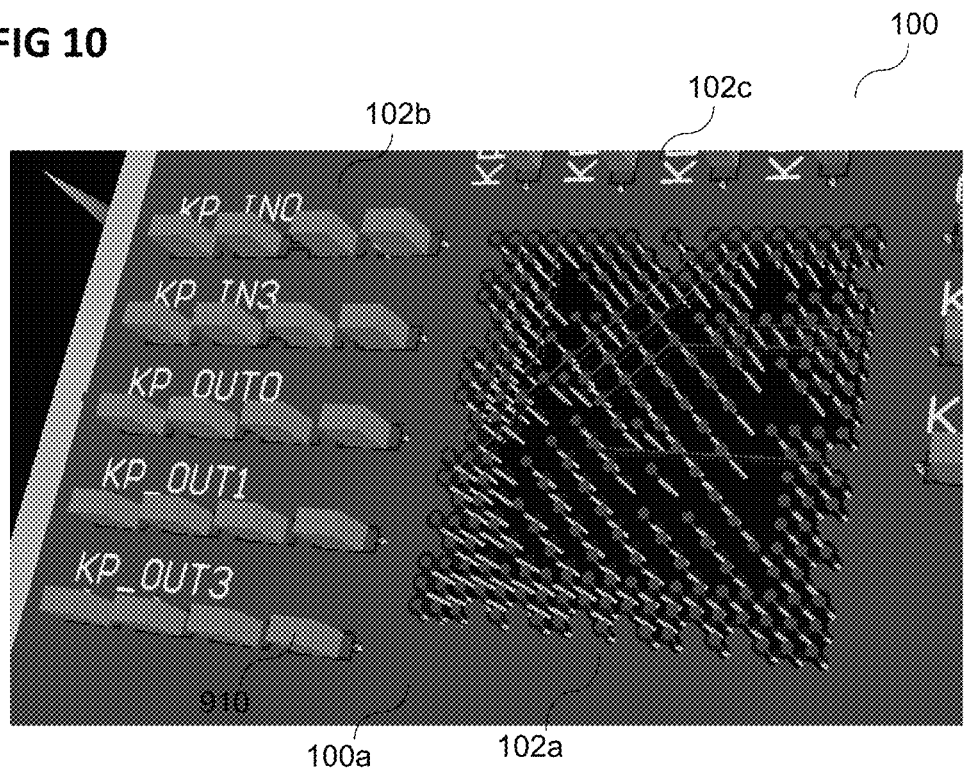
FIG. 10 schematically shows a perspective view of a board or fan-out board.

FIG. 10 shows a fan-out board 100 in a schematic view as already described herein. The fan-out board 100 may include more than one fan-out regions 102b, 102c to access the desired pins of an integrated circuit under test being connected to the board contact pads 104, 110 in the integrated circuit region 102a.

With this fan-out system 100 in place, the system verification board 230 (or evaluation board 230) may operate the integrated circuit under test 220 through a series of functional tests, driving the system into various operational states. The states that an arbitrary device under test may be placed into cannot be exhaustively described herein due to the many different categories of integrated circuits that this method can be applied to. The following states are merely an example of several of the possible functions of the integrated circuit controlling a mobile device: connecting to a Wi-Fi network, recording video, transmitting data over Bluetooth, saving data to an SD card (secure digital memory card). During these functional states, or state transitions, pins 222 of the integrated circuit under test being accessible by the previously described fan-out board 100 can be stressed with the ESD test signal (e.g. a TLP) in a search for relationships between functional states of the integrated circuit and pin-specific sensitivities. Using the integrated circuit testing arrangement 200, as described herein, may enable testing normally hidden pins with direct stress pulses, and therefore, a detailed device susceptibility model can be compiled which can then be used to dictate board-level ESD protection strategies for end user products, or defensive programming strategies for control software.

A hidden pin which can be tested using the integrated circuit testing arrangement 200, as described herein, may be an internal ESD sensitive pin (e.g. a control pin, a reset pin, and also a high speed data line, and the like). A hidden pin may also be inductively coupled during a discharge to the case of a device and/or to an adjacent trace of an exposed non hidden pin. Using the fan-out board 100 and/or using the integrated circuit testing arrangement 200, as described herein, may allow testing ESD sensitive internal pins, and therefore, sensitive pins may be identified. Further, the fan-out board 100 may allow testing active integrated circuits to evaluate soft failures.

Using the fan-out board 100 and/or using the integrated circuit testing arrangement 200 may allow correlating the ESD behavior of hidden pins in dependence from the respective functional state of the device under test.

A test result of the ESD testing may be for example at least one of the following results: the integrated circuit under test continues to work without interruption (the integrated circuit may pass the ESD test), a soft error may occur that may be correct by the integrated circuit under test, a soft error may occur that may require an intervention, such as rebooting, and a physical failure which may damage the integrated circuit under test.

An integrated circuit under test, as described herein, may also be an electronic device under test, e.g. a mobile phone.

The contact pads as described herein may be configure as balls, e.g. solder balls. A set of contact pads, as described herein, may include or may be a ball grid array (BGA) or a pin grid array (PGA).

The integrated circuit 220 may be mounted on the fan-out board 100 in flip chip technology or in a way similar to flip chip technology.

As an alternative spacer board—fan-out board arrangement, the fan-out board 100 may include at least a bottom part (a spacer region) and a top part (a fan-out board region), where the top part may be larger than the bottom part to enable the placement of the test pads 106. The bottom part may be thick enough to lift the top part above the surface mounted components 348a arranged on the test board 230 in the vicinity.

A suitable fan-out board 100 (or fan-out/spacer board 100/340) may be formed for example by appropriately shaping the fan-out board 100 during the board manufacturing process or by fixing (soldering, gluing) two separate boards, e.g. a fan-out board 100 and a spacer board 340, on top of each other.

The fan-out board 100 may be firmly assembled on the system board 230 (e.g. by soldering or gluing) or may be removable for an easy exchange of the fan-out board in case it is damaged due to the ESD stress pulses.

The spacer board 340 may be soldered to the test board and a soft interposer structure 360 (or a soft interposer structure region 360 of the fan-out board 100) may connect the fan-out board 100 with the spacer board 340. In other words, the interposer structure 360 may be a part of the fan-out board 100.

The system verification board 230 may include a socket for the communication device under test 220. The communication device under test 220 may be fully functional at that time the ESD testing may be performed, e.g. using the fan-out board 100 or integrated circuit testing arrangement 200, as described herein. The system verification board 230 may be configured to check if the hardware, e.g. the integrated circuit under test, may be compatible with firmware. The system verification board 230 may operate all desired functions of the device under test as specified by the firmware of the platform.

The fan-out board 100 may be adapted to the specific integrated circuit under test 220 such that the system verification board 230 may not need to be adapted. This may save development and testing costs.

The fan-out board 100, as described herein, may allow forcing an ESD (TLP) pulse into the system under test, and may provide more entry points for injecting the ESD signal into the system under test. The fan-out board 100, as described herein, may provide access to one or more measuring points being commonly hidden or not accessible.

The components on the verification board may be in the sub-mm regime.

The spacer board 340 may include a bump arrangement (spacer board contact pads 346) being compatible to the test board landing pads 232 (as designed for the integrated circuit under test 220).

30 to 50 signals of the chip 220 may be tested (mixed signal functionality), for example. Any other desired number of signals of the chip 220 may be tested depending on the chip design.

A board or a fan-out board may include: a first set of board contact pads arranged on a first side of the board, the contact pads of the first set of board contact pads configured to electrically connect to integrated circuit contact pads of an integrated circuit to be tested, wherein the positions of the contact pads of the first set of board contact pads are matched to the positions of the integrated circuit contact pads; a fan-out region on the first side of the board, the fan-out region including one or more fan-out contact pads configured to at least one of receive a test signal and provide a measurement signal; wherein at least one contact pad of the one or more fan-out contact pads electrically conductively connects to at least one contact pad of the first set of board contact pads; and a second set of board contact pads on a second side of the board, the second set of board contact pads configured to electrically connect to test board contact pads of a test board; wherein the positions of the contact pads of the second set of board contact pads are matched to the positions of the test board contact pads; wherein at least one contact pad of the second set of board contact pads electrically conductively connect to at least one contact pad of the first set of board contact pads. The integrated circuit contact pads of an integrated circuit under test may include at least one of a pin, a pin array, a solder ball, ball array, an SMT pad or an SMT pad array. The board contact pads and/or the fan-out contact pads may include at least one of a pin, a pin array, a solder ball, ball array, an SMT pad or an SMT pad array.

An integrated circuit testing arrangement may include an integrated circuit under test including a plurality of integrated circuit contact pads; a test board including a plurality of test board contact pads; a fan-out board including: a first set of board contact pads arranged on a first side of the fan-out board, the contact pads of the first set of board contact pads electrically connecting to the integrated circuit contact pads of the integrated circuit under test; a fan-out region on the first side of the fan-out board, the fan-out region including one or more fan-out contact pads configured to at least one of receive a test signal and provide a measurement signal; wherein at least one contact pad of the one or more fan-out contact pads electrically conductively connects to at least one contact pad of the first set of board contact pads; and a second set of board contact pads on a second side of the fan-out board, the contact pads of the second set of board contact pads electrically connecting to the test board contact pads of the test board, wherein at least one contact pad of the second set of board contact pads electrically conductively connects to at least one contact pad of the first set of board contact pads.

The integrated circuit may be disposed over the first side of the fan-out board and the test board may be disposed over the second side of the fan-out board.

The test board may include a system verification board configured to enable the operation of the integrated circuit under test.

The operation of the integrated circuit under test may include connecting to a Wi-Fi network, recording video, transmitting data over Bluetooth, saving data to an SD card (secure digital memory card).

The integrated circuit testing arrangement may further include a testing device electrically coupling to at least one contact pad of the one or more fan-out contact pads to provide and to analyze one or more test signals of the integrated circuit under test.

The integrated circuit testing arrangement may further include a testing device being electrically coupled to at least one contact pad of the one or more fan-out contact pads to provide and to analyze one or more test signals while the integrated circuit under test is operated by the test board.

The fan-out board may be configured to inject at least one of a voltage and a current provided by the testing device into at least one contract pad of the integrated circuit under test.

The fan-out board may be configured to inject an electro static discharge test signal (ESD test signal) provided by the testing device into at least one contract pad of the integrated circuit under test.

The integrated circuit testing arrangement may include a spacer board being disposed between the test board and the fan-out board to provide a spacing between the test board and the fan-out board, the spacer board including a wiring structure electrically connecting each contact pad of the second set of board contact pads to the respective contact pad of the test board contact pads.

The wiring structure of the spacer board may include: a first set of spacer board contact pads on a first side of the spacer board facing towards the fan-out board, wherein the positions of the contact pads of the first set of spacer board contact pads match to the positions of the contact pads of the second set of board contact pads of the fan-out board; a second set of spacer board contact pads on a second side of the spacer board facing towards the test board, wherein the positions of the contact pads of the second set of spacer board contact pads match to the positions of the test board contact pads of the test board; and a plurality of vias extending from the first side of the spacer board to the second side of the spacer board electrically connecting each contact pad of the first set of spacer board contact pads to the respective contact pad of the second set of spacer board contact pads. The spacer board contact pads may include at least one of a pin, a pin array, a solder ball, ball array, an SMT pad or an SMT pad array.

The wiring structure of the spacer board may include a set of through vias providing a first set of spacer board contact pads on a first side of the spacer board facing towards the fan-out board and a second set of spacer board contact pads on a second side of the spacer board facing towards the test board a second set of spacer board contact pads on a second side of the spacer board facing towards the test board.

The positions of the contact pads of the second set of board contact pads facing towards the spacer board may match to the positions of the contact pads of the first set of spacer board contact pads facing towards the fan-out board.

The positions of the contact pads of the first set of board contact pads facing towards the integrated circuit may match to the positions of the contact pads of the integrated circuit contact pads facing towards the fan-out board.

Positions of the contact pads of the second set of board contact pads facing towards the test board may match to the positions of the contact pads of the test board contact pads facing towards the fan-out board.

The spacer board may have a thickness of at least 0.5 mm providing a gap between the fan-out board and the test board.

The integrated circuit testing arrangement may further include a flexible interposer structure disposed between the test board and the fan-out board including a plurality of vias electrically connecting the contact pads of the second set of board contact pads and the test board contact pads.

The integrated circuit testing arrangement may further include a flexible interposer structure disposed between the spacer board and the fan-out board including a plurality of vias electrically connecting the contact pads of the second set of board contact pads of the fan-out board and the contact pads of the first set of spacer board contact pads.

The interposer structure may include at least one electrically insulating elastic material to absorb a mechanical load being subjected to the integrated circuit testing arrangement during at least one of manufacturing, assembling and testing.

The interposer structure may further include a plurality of flexible electrically conductive vias connecting a top side of the interposer structure with the bottom side of the interposer structure.

The testing device may be configured to provide a transmission line pulse electrostatic discharge stress signal.

A method for operating and/or testing an integrated circuit may include injecting at least one test signal into an integrated circuit under test via a fan-out board, the fan-out board may include: a first set of board contact pads arranged on a first side of the fan-out board, the contact pads of the first set of board contact pads electrically connecting to the integrated circuit contact pads of the integrated circuit under test; a fan-out region on the first side of the fan-out board, the fan-out region including one or more fan-out contact pads configured to at least one of receive a test signal and provide a measurement signal; wherein at least one contact pad of the one or more fan-out contact pads electrically conductively connects to at least one contact pad of the first set of board contact pads; and a second set of board contact pads on a second side of the fan-out board, the contact pads of the second set of board contact pads configured to electrically connect to test board contact pads of a test board, wherein at least one contact pad of the second set of board contact pads electrically conductively connects to at least one contact pad of the first set of board contact pads.

A method for operating and/or testing an integrated circuit may include injecting at least one test signal into an integrated circuit under test using the integrated circuit testing arrangement as described herein.

A method for operating and/or testing an integrated circuit may further include operating the integrated circuit under test via the test board, wherein the test board contact pads of the test board may electrically connect to the contact pads of the second set of board contact pads of the fan-out board.

Injecting at least one test signal into the integrated circuit under test may include injecting at least one test signal via at least one contact pad of the one or more fan-out contact pads.

Injecting at least one signal into the integrated circuit under test may include injecting a transmission line pulse as an electrostatic discharge stress signal.

A method for operating and/or testing an integrated circuit may further include detecting a test signal from the integrated circuit via at least one contact pad of the one or more fan-out contact pads.

Detecting a test signal from the integrated circuit under test may include detecting the voltage waveform of a voltage signal of the integrated circuit. The waveform of a signal may be detected or determined by measuring the amplitude of the signal over the time.

A method for operating and/or testing an integrated circuit may further include extracting a failure model for the integrated circuit under test base on at least one detected test signal.

A method for operating and/or testing an integrated circuit may further include monitoring one or more functional states of the integrated circuit under test operated by the test board and detecting a failure if a failure occurs.

A method for operating and/or testing an integrated circuit may further include selecting the most critical functional state of the integrated circuit under test in correlation with the injected at least one test signal.

An integrated circuit testing arrangement may include an integrated circuit under test including a plurality of integrated circuit contact pads; a test board including a plurality of test board contact pads, a fan-out board including: a first set of board contact pads arranged on a first side of the board, the contact pads of the first set of board contact pads configured to electrically connect to integrated circuit contact pads of an integrated circuit under test, the positions of the contact pads of the first set of board contact pads matching to the positions of the integrated circuit contact pads; a fan-out region on the first side of the board, the fan-out region comprising a plurality of fan-out contact pads; at least one fan-out contact pad of the plurality of fan-out contact pads configured to receive a test current signal and electrically conductively connecting to at least one contact pad of the first set of board contact pads; at least one fan-out contact pad of the plurality of fan-out contact pads configured to receive a test voltage signal and electrically conductively connecting to at least one other contact pad of the first set of board contact pads; at least one fan-out contact pad of the plurality of fan-out contact pads configured to provide a measurement signal; at least one contact pad of the one or more fan-out contact pads electrically conductively connecting to at least one contact pad of the first set of board contact pads; a second set of board contact pads on a second side of the board, the second set of board contact pads being configured to electrically connect to test board contact pads of a test board; the positions of the contact pads of the second set of board contact pads matching to the positions of the test board contact pads; at least one contact pad of the second set of board contact pads electrically conductively connecting to at least one contact pad of the first set of board contact pads.

The integrated circuit may be disposed over the first side of the fan-out board; and the test board may be disposed over the second side of the fan-out board. Furthermore, the test board may include a system verification board configured to enable the operation of the integrated circuit under test. The integrated circuit testing arrangement may further include a testing device electrically coupled to at least one contact pad of the one or more fan-out contact pads to provide and analyze one or more test signals while the integrated circuit under test is operated by the test board.

A method for operating and/or testing an integrated circuit may include: electrically conductively connecting the integrated circuit to a test board via a fan-out board; injecting at least one test signal into the integrated circuit by injecting the at least one test signal into at least one fan-out contact pad of the fan-out board; and testing the integrating circuit using the test board.

The method for operating and/or testing an integrated circuit may further include operating the integrated circuit via the test board.

Further, injecting at least one signal into the integrated circuit under test may include injecting a transmission line pulse as an electrostatic discharge stress signal.

The method for operating and/or testing an integrated circuit may further include detecting a test signal from the integrated circuit via at least one contact pad of the one or more fan-out contact pads.

Further, detecting a test signal from the integrated circuit under test may include detecting the voltage waveform of a voltage signal of the integrated circuit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A board, comprising:
   a first set of board contact pads arranged on a first side of the board, the contact pads of the first set of board contact pads configured to electrically conductively connect to integrated circuit contact pads of an integrated circuit under test, the positions of the contact pads of the first set of board contact pads matching to the positions of the integrated circuit contact pads;
   a fan-out region in the first side of the board, the fan-out region comprising one or more fan-out contact pads configured to at least one of receive a test signal and provide a measurement signal; at least one contact pad of the one or more fan-out contact pads electrically conductively connecting to at least one contact pad of the first set of board contact pads; and a second set of board contact pads on a second side of the board, the second set of board contact pads being configured to electrically conductively connect to test board contact pads of a test board; the positions of the contact pads of the second set of board contact pads matching to the positions of the test board contact pads; at least one contact pad of the second set of board contact pads electrically conductively connecting to at least one contact pad of the first set of board contact pads.

2. An integrated circuit testing arrangement, comprising:
an integrated circuit under an electrostatic discharge test comprising a plurality of integrated circuit contact pads;
a test board comprising a plurality of test board contact pads,
a fan-out board comprising:
  a first set of board contact pads arranged on a first side of the fan-out board, the contact pads of the first set of board contact pads electrically conductively connecting to the integrated circuit contact pads of the integrated circuit under test;
  a fan-out region on the first side of the fan-out board, the fan-out region comprising one or more fan-out contact pads configured to at least one of receive a test signal and provide a measurement signal; at least one contact pad of the one or more fan-out contact pads electrically conductively connecting to at least one contact pad of the first set of board contact pads;
  a second set of board contact pads on a second side of the fan-out board, the contact pads of the second set of board contact pads electrically connecting to the test board contact pads of the test board, at least one contact pad of the second set of board contact pads electrically conductively connecting to at least one contact pad of the first set of board contact pads; and
  at least one via extending through the fan-out board to electrically conductively connect the first set of board contact pads to the second set of board contact pads.

3. The integrated circuit testing arrangement of claim 2, wherein the integrated circuit is disposed over the first side of the fan-out board; and
wherein the test board is disposed over the second side of the fan-out board.

4. The integrated circuit testing arrangement of claim 2, wherein the test board comprises a system verification board configured to enable the operation of the integrated circuit under test.

5. The integrated circuit testing arrangement of claim 2, further comprising:
a testing device electrically coupled to at least one contact pad of the one or more fan-out contact pads to provide and analyze one or more test signals while the integrated circuit under test is operated by the test board.

6. The integrated circuit testing arrangement of claim 5, the fan-out board configured to inject one of a voltage and a current provided by the testing device into at least one contact pad of the integrated circuit under test.

7. The integrated circuit testing arrangement of claim 5, the fan-out board configured to inject an electro static discharge test signal provided by the testing device into at least one contract pad of the integrated circuit under test.

8. The integrated circuit testing arrangement of claim 2, further comprising:
a spacer board disposed between the test board and the fan-out board to provide a spacing between the test board and the fan-out board, the spacer board comprising a wiring structure electrically connecting each contact pad of the second set of fan-out board contact pads to the respective contact pad of the test board contact pads.

9. The integrated circuit testing arrangement of claim 8, wherein the wiring structure of the spacer board comprises:
  a first set of spacer board contact pads on a first side of the spacer board facing towards the fan-out board, the positions of the contact pads of the first set of spacer board contact pads matching to the positions of the contact pads of the second set of board contact pads of the fan-out board;
  a second set of spacer board contact pads on a second side of the spacer board facing towards the test board, the positions of the contact pads of the second set of spacer board contact pads matching to the positions of the test board contact pads of the test board; and
  a plurality of vias extending from the first side of the spacer board to the second side of the spacer board electrically connecting each contact pad of the first set of spacer board contact pads to a respective contact pad of the second set of spacer board contact pads.

10. The integrated circuit testing arrangement of claim 7, the positions of the contact pads of the second set of board contact pads matching to the positions of the contact pads of the first set of spacer board contact pads.

11. The integrated circuit testing arrangement of claim 2, the positions of the contact pads of the first set of board contact pads matching to the positions of the contact pads of the integrated circuit contact pads.

12. The integrated circuit testing arrangement of claim 2, the positions of the contact pads of the second set of board contact pads matching to the positions of the contact pads of the test board contact pads.

13. The integrated circuit testing arrangement of claim 6, wherein the spacer board has a thickness of at least 0.5 mm.

14. The integrated circuit testing arrangement of claim 2, further comprising:
a flexible interposer structure disposed between the test board and the fan-out board comprising a plurality of vias electrically connecting the contact pads of the second set of board contact pads and the test board contact pads.

15. A method for operating an integrated circuit, the method comprising:
electrically conductively connecting the integrated circuit to a test board via a fan-out board; wherein the fan-out board comprises at least one via extending therethrough to electrically conductively connect a first set of board contact pads to a second set of board contact pads;
injecting at least one test signal into the integrated circuit by injecting the at least one test signal into at least one fan-out contact pad of the fan-out board; wherein the at least one fan-out contact pad of the fan-out board is electrically conductively connected to at least one contact pad of the first set of board contact pads; and
operating the integrating circuit using the test board.

16. The method of claim 15, further comprising:
operating the integrated circuit via the test board.

17. The method of claim 15,
wherein injecting at least one signal into the integrated circuit under test comprises injecting a transmission line pulse as an electrostatic discharge stress signal.

18. The method of claim 15, further comprising:
detecting a test signal from the integrated circuit via at least one contact pad of the one or more fan-out contact pads.

19. The method of claim 18,
wherein detecting a test signal from the integrated circuit under test comprises detecting the voltage waveform of a voltage signal of the integrated circuit.

20. An integrated circuit testing arrangement, comprising:
an integrated circuit under test comprising a plurality of integrated circuit contact pads;
wherein the test comprises an injection of a transmission line pulse;
a test board comprising a plurality of test board contact pads,
a fan-out board comprising:
a first set of board contact pads arranged on a first side of the board, the contact pads of the first set of board contact pads configured to electrically connect to integrated circuit contact pads of an integrated circuit under test, the positions of the contact pads of the first set of board contact pads matching to the positions of the integrated circuit contact pads;
a fan-out region on the first side of the board, the fan-out region comprising a plurality of fan-out contact pads
at least one fan-out contact pad of the plurality of fan-out contact pads configured to receive a test current signal and electrically conductively connecting to at least one contact pad of the first set of board contact pads;
at least one fan-out contact pad of the plurality of fan-out contact pads configured to receive a test voltage signal and electrically conductively connecting to at least one other contact pad of the first set of board contact pads;
at least one fan-out contact pad of the plurality of fan-out contact pads configured to provide a measurement signal;
at least one contact pad of the one or more fan-out contact pads electrically conductively connecting to at least one contact pad of the first set of board contact pads;
a second set of board contact pads disposed directly on a second side of the board, the second set of board contact pads being configured to electrically connect to test board contact pads of a test board; the positions of the contact pads of the second set of board contact pads matching to the positions of the test board contact pads;
at least one contact pad of the second set of board contact pads electrically conductively connecting to at least one contact pad of the first set of board contact pads; and
at least one via extending through the fan-out board to electrically conductively connect the first set of board contact pads to the second set of board contact pads.

21. The integrated circuit testing arrangement of claim 20,
wherein the integrated circuit is disposed over the first side of the fan-out board; and
wherein the test board is disposed over the second side of the fan-out board.

22. The integrated circuit testing arrangement of claim 20,
wherein the test board comprises a system verification board configured to enable the operation of the integrated circuit under test.

23. The integrated circuit testing arrangement of claim 20, further comprising:
a testing device electrically coupled to at least one contact pad of the one or more fan-out contact pads to provide and analyze one or more test signals while the integrated circuit under test is operated by the test board.

* * * * *